United States Patent [19]
Yamaue et al.

[11] Patent Number: 5,642,212
[45] Date of Patent: Jun. 24, 1997

[54] DISPLAY APPARATUS HAVING A TWO-TERMINAL DEVICE INCLUDING A ZINC SULFIDE LAYER AND METHOD FOR PRODUCING THE SAME

[75] Inventors: Satoshi Yamaue, Tenri; Masahiro Adachi, Nara; Hiroshi Morimoto, Kitakatsuragi-gun; Masaru Yoshida, Ikoma-gun; Yasuyoshi Kaise, Tenri, all of Japan

[73] Assignee: Sharp Kabushiki Kaisha, Osaka, Japan

[21] Appl. No.: 191,198

[22] Filed: Feb. 2, 1994

[30] Foreign Application Priority Data

Feb. 3, 1993 [JP] Japan .................................. 5-016568
Sep. 16, 1993 [JP] Japan .................................. 5-230579
Dec. 15, 1993 [JP] Japan .................................. 5-315620

[51] Int. Cl.$^6$ .................................................. G02F 1/1343
[52] U.S. Cl. .................................................. 349/41; 349/49
[58] Field of Search .................................. 359/58, 59, 60, 359/74, 79; 257/60

[56] References Cited

U.S. PATENT DOCUMENTS

| | | | |
|---|---|---|---|
| 4,413,883 | 11/1983 | Baraff et al. . | |
| 4,730,903 | 3/1988 | Yamazaki et al. | 350/334 |
| 4,775,549 | 10/1988 | Ota et al. | 427/38 |
| 4,828,967 | 5/1989 | Mase et al. | 354/58 |
| 5,019,530 | 5/1991 | Kleinsasser et al. | 437/175 |
| 5,056,894 | 10/1991 | Kuijk et al. | 359/58 |
| 5,319,468 | 6/1994 | Yamada et al. | 359/58 |
| 5,396,354 | 3/1995 | Shimada et al. | 359/58 |

FOREIGN PATENT DOCUMENTS

| | | |
|---|---|---|
| 0377757 | 7/1990 | European Pat. Off. . |
| 0464810 A2 | 1/1992 | European Pat. Off. . |
| 49-75096 | 7/1974 | Japan . |
| 61-32673 | 7/1986 | Japan . |
| 61-32674 | 7/1986 | Japan . |
| 1-270027 | 10/1989 | Japan . |
| 5-12688 | 2/1993 | Japan . |
| 5-72570 | 3/1993 | Japan . |
| 6-313899 | 11/1994 | Japan . |

OTHER PUBLICATIONS

IBM Technical Disclosure Bulletin, vol. 28, No. 9, Feb. 1986, New York, US, pp. 4185–4186, "LCD Including a Non–Linear Characteristic Layer".

Patent Abstracts of Japan, vol. 017, No. 402 (P–1580), 27 Jul. 1993, & JP–A–05 072567 (Toppan Printing Co. Ltd.) 26 Mar. 1993.

Patent Abstracts of Japan, vol. 011, No. 181 (P–585), 11 Jun. 1987 & JP–A–62 011828 (Seiko Epson Corp) 20 Jan. 1987.

"Liquid Crystal Display", Sharp Corp., Liquid Crystal Display Division, p. 71, Sep. 1, 1991, with partial English translation.

S. Mitsui et al, SID 92 Digest, pp. 437–440, May, 1992, "Late–News Paper:Bright Reflective Multicolor LCDs Addressed by a Si TFTS".

(List continued on next page.)

*Primary Examiner*—William L. Sikes
*Assistant Examiner*—James A. Dudek
*Attorney, Agent, or Firm*—Nixon & Vanderhye P.C.

[57] ABSTRACT

A display apparatus including a plurality of pixel electrodes arranged in a matrix on a first substrate; a scanning line for sending a signal to the plurality of pixel electrodes for driving the plurality of pixel electrodes; a switching device for receiving the signal from the scanning line and switching each of the plurality of pixel electrodes into one of a conductive state and a non-conductive state in accordance with the signal; a counter electrode on a second substrate opposed to the first substrate; and a display medium layer sandwiched between the first substrate and the second substrate. The switching device includes a two-terminal element having a first electrode which is a part of the scanning line; the zinc sulfide layer on the first electrode, said zinc sulfide layer having an I-V characteristic expressed by a continuous curve; and a second electrode located on the zinc sulfide layer and electrically connected to the pixel electrode.

41 Claims, 19 Drawing Sheets

OTHER PUBLICATIONS

Barov et al, Japanese Patent Publication No. 1-35352, published Jul. 25, 1989, with partial English translation.

Sutherland, "A Theory For Negative Resistance and Memory Effects in Thin Insulating Films and its Application to Au–ZnS–Au Devices", J. Phys. D. Appl. Phys. 1971, vol. 4, pp. 468–479.

Database WPI, Section Ch, Week 8124, Derwent Publications Ltd., London, GB; class L03, AN 81-43253 & JP-A-56 046 584.

Lechner et al, "Liquid Crystal Matrix Displays", Proceedings of the IEEE, vol. 59, No. 11, pp. 1566–1579, Nov. 1971.

Castleberry, "Varistor–Controlled Liquid–Crystal Displays", IEEE Transactions on Electron Devices, vol. ED–26, No. 8, pp. 1123–1128, Aug. 1979.

Baraff et al, "The Optimization of Metal–Insulator–Metal Nonlinear Devices for Use in Multiplexed Liquid Crystal Displays", IEEE Transactions on Electron Devices, vol. ED–28, No. 6, pp. 736–739, Jun. 1981.

Murray et al, "Conduction in Thin Films of R.F. Reactively Sputtered Zinc Sulphide", Thin Solid Films, 22, 1974, pp. 37–44.

Fukuzawa et al, "Mechanism of Memory Phenomena in Evaporated Amorphous ZnS Films", Applied Physics, vol. 46, No. 7, 1977.

LIGHT

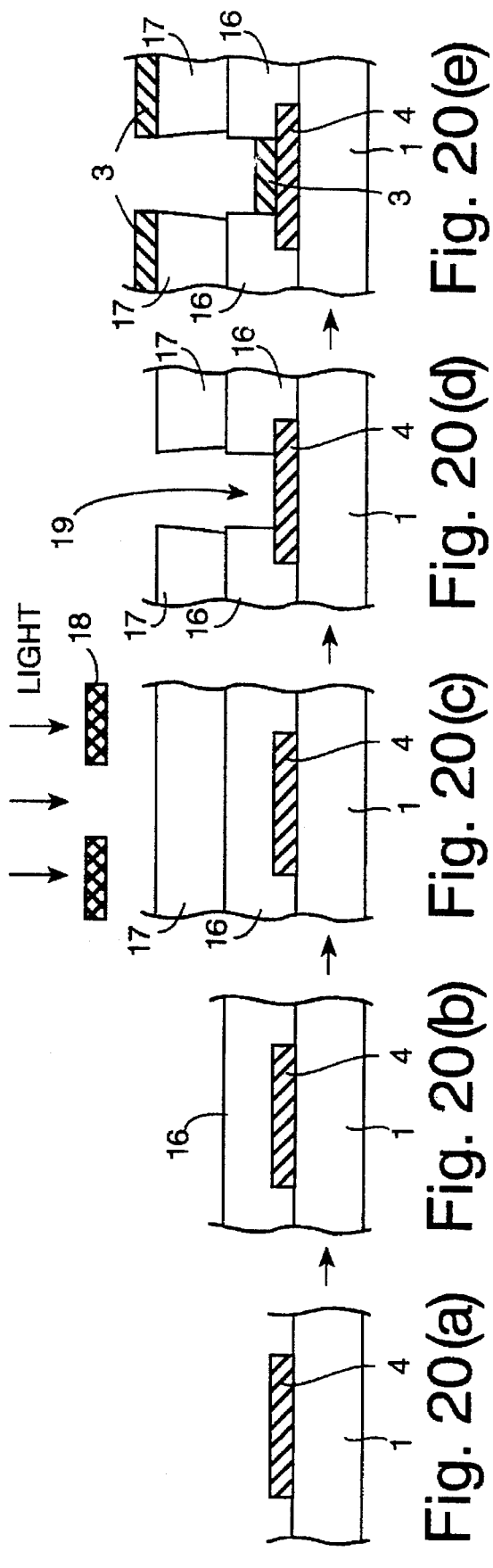

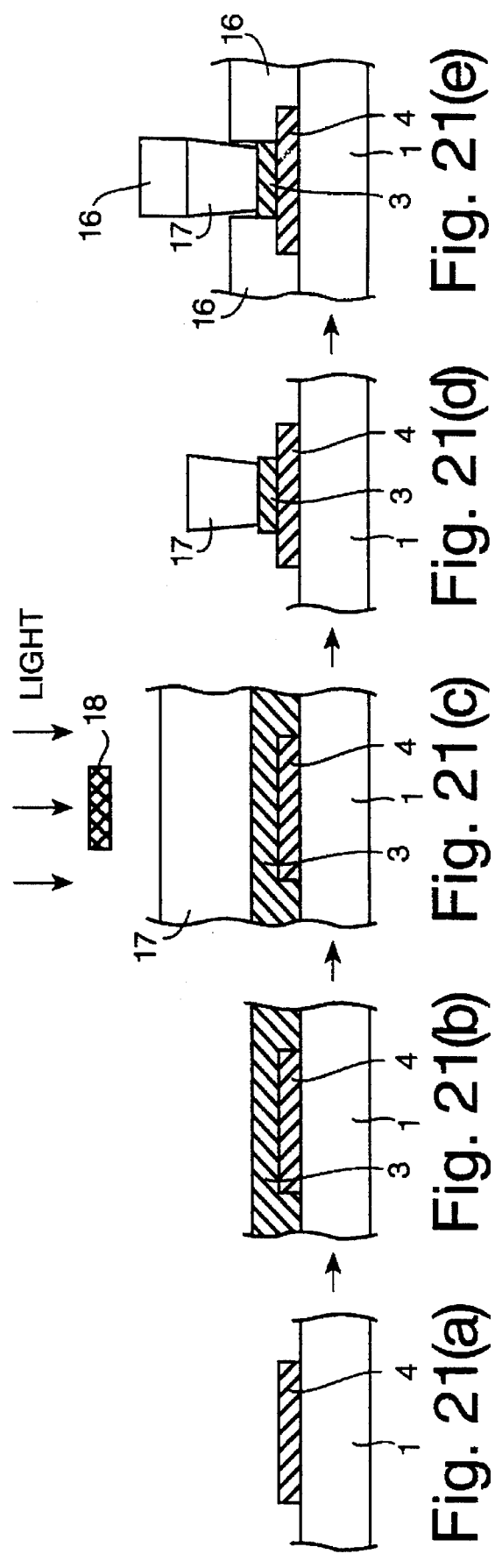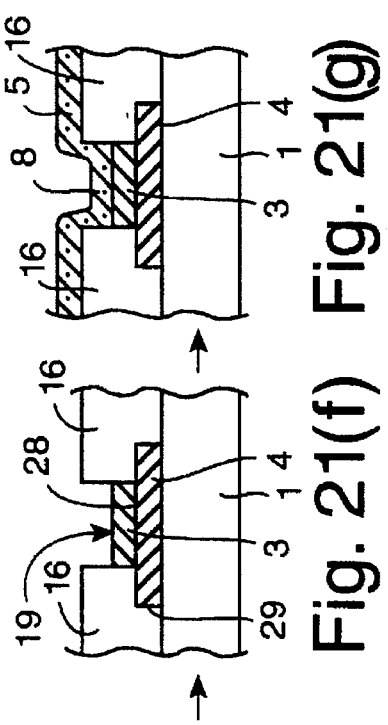

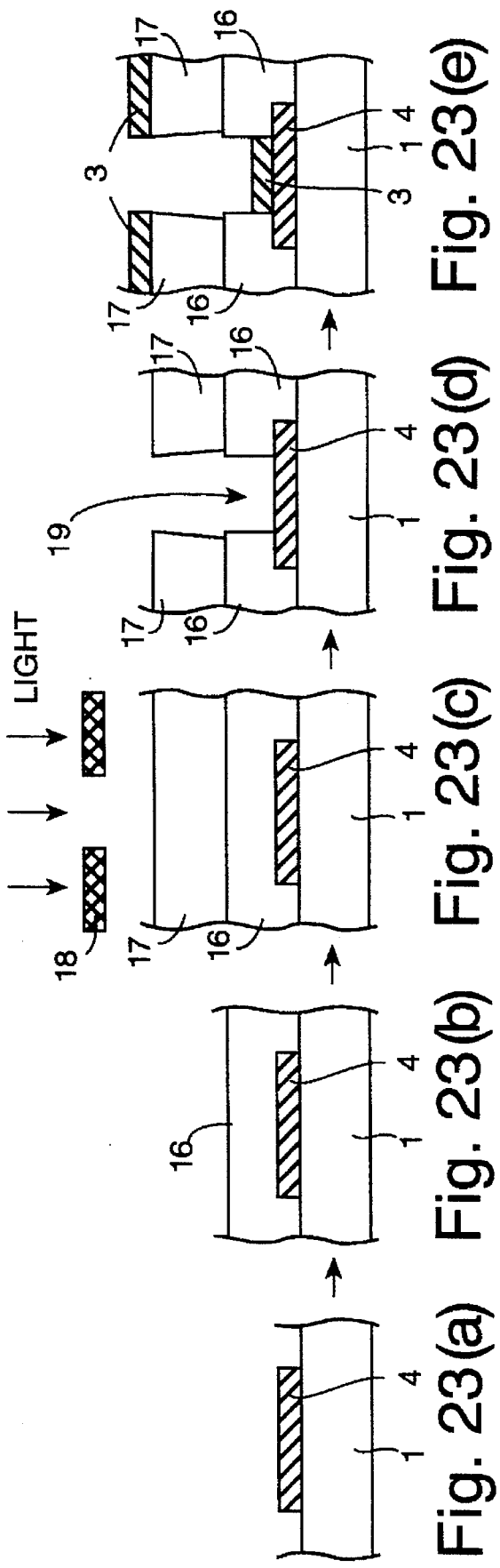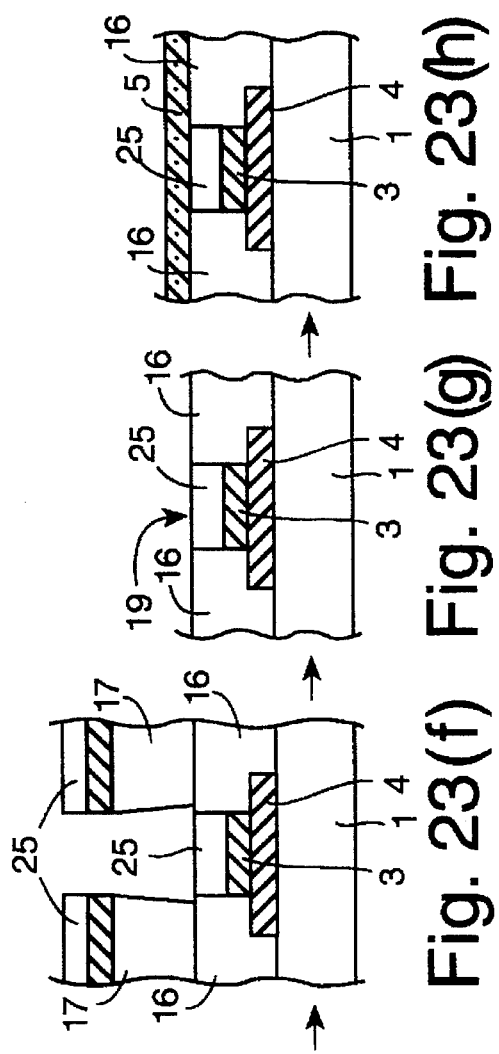

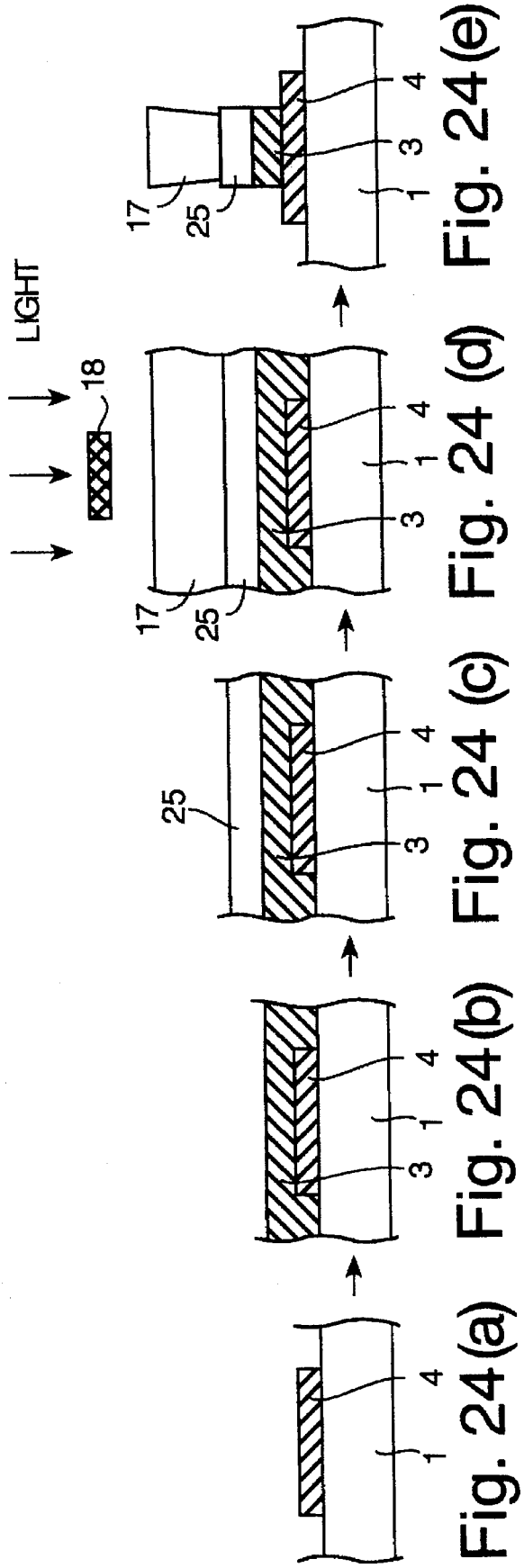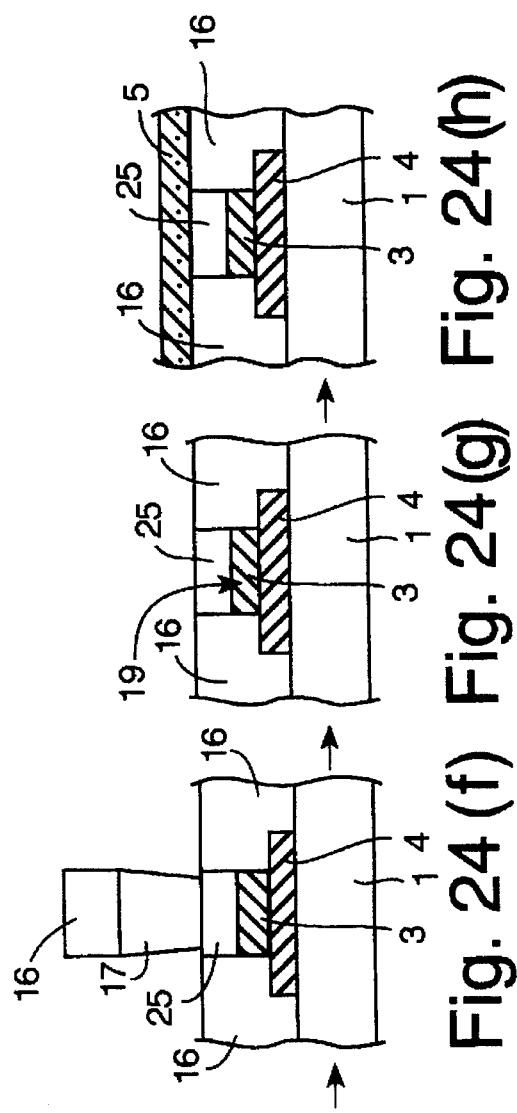

DISPLAY APPARATUS HAVING A TWO-TERMINAL DEVICE INCLUDING A ZINC SULFIDE LAYER AND METHOD FOR PRODUCING THE SAME

BACKGROUND OF THE INVENTION

1. Field of the Invention

The present invention relates to a display apparatus using a two-terminal device as a switching device and a method for producing the same.

2. Description of the Related Art

A representative display apparatus replacing CRTs which have been used for a long time is a liquid crystal display apparatus (hereinafter, referred to as the "LCD apparatus"). LCD apparatuses use a liquid crystal layer including liquid crystal molecules as a display medium. Letters and images are displayed by applying a voltage to the liquid crystal layer in order to cause changes in the electrooptic properties of the liquid crystal molecules. In order to display high quality images by providing pixels at a high density, each pixel is supplied with a nonlinear active element (switching device) for driving the LCD apparatus. This system of driving is referred to as the "active matrix driving system". The switching devices are mainly available in two types: two-terminal devices such as MIM (metal insulator metal) elements, diodes, and varistors; and three-terminal devices such as TFTs (thin film transistors) and MOS-FETs (metal oxide semiconductor field effect transistors).

The three-terminal devices function as switching devices and are suitable for displaying an image having various tones, for which different pixels are used for each of the different tones. However, the three-terminal devices have some inconveniences in that the complicated production process including repetition of exposure to light can easily cause defects in the obtained devices, thus resulting in low production yields. The two-terminal devices, which have a simpler structure than that of the three-terminal devices, are produced by a simpler method due, for example, to fewer steps of masking required. Accordingly, the production yield of the two-terminal devices is higher than that of the three-terminal devices. For this reason, methods for driving pixels using the two-terminal devices, especially by utilizing a nonlinear part of the operating characteristics of the two-terminal devices, have been actively researched and developed.

There are mainly two methods to use the two-terminal devices in a display apparatus. One is to utilize the nonlinearity of the capacitance of the two-terminal devices, and the other is to utilize the nonlinearity of the electric resistance of the two-terminal devices.

Methods to utilize the nonlinearity of the capacitance of the two-terminal devices for an LCD apparatus are described by Grabmair et al. in Mol. Cryst. Liq. Cryst. 15 (1971) and by Tannas in SID'73 Symp. Digest (1973). In these publications, ferroelectric liquid crystals are used. However, such methods have not been put into practical use. The reasons include (1) a large driving voltage is required; and (2) since the dielectric constant of the ferroelectric liquid crystals largely depends on temperature, the characteristics of the resultant LCD apparatus also largely depend on temperature.

Utilization of the nonlinearity of the electric resistance is described by Lechner in Proc. IEEE 59. (1971), by Castleberry in IEEE. Trans. Electron Devices ED-26 (1979), and by Baraff in IEEE. Trans. Electron Devices ED-28 (1981). Lechner uses a diode, Castleberry uses a varistor formed of ZnO, and Baraff uses an MIM element.

A display apparatus using an MIM element includes the following advantages.

(1) The area occupied by an MIM element in one pixel is smaller than the area occupied by a TFT. Accordingly, the ratio of an area of pixels with respect to an image plane (the opening ratio) is larger than in the case of a TFT.

(2) Since the scanning lines and the signal lines do not intersect each other on a substrate as they do in the case of a TFT, there are fewer line defects caused by insufficient insulation at the intersections.

(3) The production process is simpler, e.g., the number of masking steps is smaller than in the case of a TFT. Accordingly, the production yield is higher.

(4) There is no electric current excited by light, which is a problem in TFTs using amorphous silicon, diodes and the like. This eliminates the necessity of shielding the MIM element from external light.

Briefly referring to FIGS. 26 and 27. A conventional display apparatus 50 will be described. FIGS. 26 and 27 show an example of a conventional display apparatus 50 including a conventional MIM element 58 as a switching device. FIG. 26 is a top view of a pixel and the vicinity thereof in the display apparatus 50; and FIG. 27 is a cross sectional view of the display apparatus 50 shown in FIG. 26 looking along section line 27'—27' in FIG. 26.

The display apparatus 50 includes an insulating substrate 51 formed of glass or the like. A scanning line 52 formed of tantalum (Ta) is on a top surface of the substrate 51. An electrode 56 is branched from the scanning line 52 perpendicularly to the scanning line 52. A surface of the scanning line 52 and a surface of the electrode 56 are anodized so as to be an insulation layer 53. Specifically, the insulation layer 53 is formed of $Ta_2O_5$. A rectangular metal layer 54 formed of Ta or the like is on the substrate 51, covering the insulation layer 53. The metal layer 54 is arranged in a direction so as to cross the electrode 56. A generally rectangular pixel electrode 55 as is shown in FIG. 26 is on the substrate 51, covering two ends of the metal layer 54.

The MIM element 58 includes a three-layer structure including the electrode 56, the insulation layer 53, and the metal layer 54. The electrode 56 acts as a first metal layer, the insulation layer 53 acts as an active layer, and the metal layer 54 acts as a second metal layer. Display apparatuses including such a two-terminal device having nonlinear characteristics are now produced as commercial products.

Japanese Patent Publication Nos. 61-32673 and 61-32674 each disclose an LCD apparatus including an MIM element as the two-terminal device.

In order to use the above-described two-terminal device as a switching device, the voltage V applied to an active layer (the insulation layer in the case of an MIM element) between the first metal layer and the second metal layer and the current I flowing between the two metal layers in accordance with the voltage V should have the following I-V characteristic:

(1) The current I rises steeply in accordance with the rise of the voltage V. In other words, the I-V characteristic has a satisfactory steepness.

(2) The absolute value of the current I depends on the absolute value of the applied voltage V and is independent of the polarity (+ or −) of the voltage V. In other words, the I-V characteristic has a satisfactory symmetry in the polarity of the voltage.

For obtaining an image which is entirely uniform in quality, all the pixels in the image plane should have an I-V characteristic excellent both in steepness and symmetry.

FIG. 28 is a graph illustrating a curve representing the I-V characteristic of a conventional MIM element used, for example, in the display apparatus 50. As is apparent from FIG. 28, the I-V characteristic does not show the above-mentioned symmetry. This fact is attributable to the following reasons (1) and (2) below.

(1) The first metal layer is in contact with the insulation layer formed by anodizing the first metal layer. The second metal layer is formed on the insulation layer by sputtering or CVD (chemical vapor deposition). The interface between the first metal layer and the insulation layer and the interface between the second metal layer and the insulation layer are formed by different processes from each other. Accordingly, these two interfaces are in different states.

(2) While the first metal layer is anodized, impurities go into the insulation layer, thus causing the interface between the first metal layer and the insulation layer and the vicinity thereof to have a different dopant concentration from that at the interface between the second metal layer and the insulation layer and the vicinity thereof.

As is described above, the state of the interface between the first metal layer and the insulation layer and the state of the interface between the second metal layer and the insulation layer influence the I-V characteristic of the MIM element. Accordingly, types of metal usable for the MIM element are restricted. Conventionally, where Ta is used for the first metal layer and $Ta_2O_5$ is used for the insulation layer, the second metal layer is formed of Cr, Ta or Ti. If the second metal layer is formed of Al, or ITO (indium tin oxide), the symmetry of the I-V characteristic is significantly deteriorated.

The I-V characteristic of the MIM element is expressed by Equations (1), (2) and (3) by Poole-Frenkel current.

$$I = \alpha \cdot V \cdot \exp(\beta \sqrt{V}) \quad (1)$$

$$\alpha = (n\mu q/d) \cdot \exp(-\phi/(kT)) \quad (2)$$

$$\beta = (1/(kT)) \sqrt{(q^3/(\pi \epsilon d))} \quad (3)$$

where q is the electric charge, n is the carrier density, $\mu$ is the mobility, $\phi$ is the depth of the trap, d is the thickness of the insulation layer, T is the temperature, k is the Boltzmann constant, and $\epsilon$ is the dielectric constant.

As is apparent from Equation (1), $\beta$ which is expressed by Equation (3) indicates the steepness of the I-V characteristic. It is preferable to obtain the highest possible value for $\beta$. For example, the value of $\beta$ is approximately 3 to 4 inclusive in the MIM element including the insulation layer formed of $Ta_2O_5$, while the value of $\beta$ in a varistor, which is a type of the two-terminal device, is approximately 7 to 8 inclusive. This signifies that the MIM element using $Ta_2O_5$ for the insulation layer is inferior to the varistor in the I-V characteristic in the steepness.

It is apparent from Equation (3) that the value of $\beta$ depends on the thickness d of the insulation layer. Therefore, the I-V characteristic changes in accordance with any slight difference in the thickness d. This causes dispersion among the curves representing the I-V characteristic of a plurality of MIM elements for driving respective pixels. As a result, the pixels are put into different display states, thus deteriorating the display quality of the whole image.

Conventional two-terminal devices, for example, the MIM element, also have the following problems in the production process.

In the case where the active layer (for example, the insulation layer 53 in the case of the MIM element 58 in FIG. 27) insufficiently covers the first metal layer (the first electrode) 56, especially on a tapered side surface 57 of the first metal layer 56 and the vicinity thereof, insulation breakdown occurs in the MIM element 58. In this specification, the vicinity of the tapered side surface 57 includes an edge formed at the junction of a top surface 59 of the first metal layer 56 and the tapered side surface 57 and also includes an edge formed at the junction of the tapered side surface 57 and the interface between the first metal layer 56 and the base substrate 51.

For example, in the case where the first metal layer 56 is patterned by etching, insufficient insulation of the tapered side surface 57 and the vicinity thereof adversely influences the performance of the MIM element 58, thereby causing defects and deterioration in the MIM element 58.

In order to solve these problems, some proposals have been made.

One of the proposals is made in Japanese Laid-Open Patent Publication No. 1-270027, which discloses an MIM element as is shown in FIG. 29.

As is shown in FIG. 29, a display apparatus 60 includes a substrate 61. A first metal layer 62 is on a top surface of the substrate 61. A surface of the first metal layer 62 is anodized so as to be an insulation layer 63 (active layer). An insulating intermediate layer 66 is on the substrate 61, covering the insulation layer 63. The intermediate layer 66 has a hole 67 reaching a top flat surface 68 of the insulation layer 63. A second metal layer 64 is on the intermediate layer 66. A pixel electrode 65 is on the intermediate layer 66, covering an end of the second metal layer 64. The second metal layer 64 is in contact with the insulation layer 63 through the hole 67 and also is in contact with the pixel electrode 65. By such a structure, an MIM element 70 includes a flat portion of the first metal layer 62, but excludes a tapered side portion 69 and the vicinity thereof in the first metal layer 62. Accordingly, the performance of the MIM element 70 is protected against adverse influences caused by insufficient insulation of the tapered side portion 69 and the vicinity thereof.

Japanese Laid-Open Patent Publication No. 5-72570 discloses a method for producing an MIM element 80 as is shown in FIG. 30. In FIG. 30, identical elements with those in FIG. 29 bear identical reference numerals therewith.

According to this method, after the first metal layer 62 is formed in a pattern on a top surface of the substrate 61, the insulation layer 63 (active layer) and the intermediate layer 66 are formed by radiating light using the first metal layer 62 as a mask (a photoresist method) from the side of a bottom surface of the substrate 61. As a result, the insulation layer 63 is formed only on a flat top surface 71 of the first metal layer 62. Due to such a structure, the problem of insulation breakdown due to insufficient insulation of a tapered side portion and the vicinity thereof is solved.

However, in order to realize the structure shown in FIG. 29, in which the second metal layer 64 is in contact with the insulation layer 63 and also is in contact with the pixel electrode 65, a part of the intermediate layer 66 and a part of the insulation layer 63 should selectively be etched away. If the insulation layer 63 is formed of a material having a low resistance against chemicals used as an etchant, it is difficult to realize the structure shown in FIG. 29.

In the case where the photoresist method is used as in FIG. 30, the manufacturing precision will be quite limited.

Due to these reasons, it is difficult to put the display apparatus 60 shown in FIG. 29 and the MIM element 80 into practical use.

In the structure shown in FIG. 29, the insulation layer 63 is formed in areas other than the MIM element 70. Accordingly, the leak current has undesirable increases, so the impedance undesirably changes in accordance with the change in the applied voltage. For these reasons, the display quality declines.

SUMMARY OF THE INVENTION

A display apparatus according to the present invention includes a plurality of pixel electrodes arranged in a matrix on a first substrate; a scanning line for sending a signal to the plurality of pixel electrodes for driving the plurality of pixel electrodes; a switching device for receiving the signal from the scanning line and switching each of the plurality of pixel electrodes into one of a conductive state and a non-conductive state in accordance with the signal; a counter electrode on a second substrate opposed to the first substrate; and a display medium layer sandwiched between the first substrate and the second substrate. The switching device includes a two-terminal element having: a first electrode which is a part of the scanning line; the zinc sulfide layer on the first electrode, the zinc sulfide layer having an I-V characteristic expressed by a continuous curve; and a second electrode located on the zinc sulfide layer and electrically connected to the pixel electrode.

In one embodiment of the invention, the zinc sulfide layer has a thickness of 10 nm to 1 µm.

In one embodiment of the invention, the zinc sulfide layer is on an entire surface of the first substrate, covering the scanning line.

In one embodiment of the invention, the zinc sulfide layer is on a specified area of the first electrode excluding a side surface and the vicinity thereof which includes an edge formed at the junction of a top surface and the side surface of the first electrode and an edge formed at the junction of the side surface and the interface between the first electrode and the first substrate.

In one embodiment of the invention, the first electrode is branched from the scanning line.

In one embodiment of the invention, the first electrode is a specified area within the scanning line.

In one embodiment of the invention, the second electrode and the pixel electrode are formed of identical materials.

In one embodiment of the invention, the second electrode is branched from the pixel electrode.

In one embodiment of the invention, the second electrode is a specified area within the pixel electrode.

In one embodiment of the invention, the display apparatus further includes an insulation layer sandwiched between the pixel electrode and the first substrate except for the specified area on which the zinc sulfide layer is located.

In one embodiment of the invention, the display apparatus further includes a first insulation layer sandwiched between the first electrode and the zinc sulfide layer.

In one embodiment of the invention, the first insulation layer is obtained by anodizing the first electrode.

In one embodiment of the invention, the display apparatus further includes a second insulation layer sandwiched between the zinc sulfide layer and the second electrode.

In one embodiment of the invention, the second insulation layer has a hole, through which the second electrode and the zinc sulfide layer are electrically connected with each other.

In one embodiment of the invention, the display apparatus further includes a first insulation layer sandwiched between the first electrode and the zinc sulfide layer and a second electrode sandwiched between the zinc sulfide layer and the second electrode.

In one embodiment of the invention, the first insulation layer and the second insulation layer are formed of identical materials.

In one embodiment of the invention, the hole has an opening having an area from 10 µm² to 1,000 µm² inclusive.

In one embodiment of the invention, the zinc sulfide layer includes dopant.

In one embodiment of the invention, the dopant is selected from the group consisting of manganese, copper, rare earth elements, compounds including a rare earth element, and the III-group elements.

In one embodiment of the invention, the zinc sulfide layer is formed so as to have a composition ratio expressed by 1>x>0.5 where the zinc sulfide layer has a composition expressed by $Zn_xS_{(1-x)}$.

In one embodiment of the invention, the first insulation layer is formed of a substance selected from the group consisting of nitrogen compounds and silicon oxide.

In one embodiment of the invention, the second insulation layer is formed of a substance selected from the group consisting of nitrogen compounds and silicon oxide.

In one embodiment of the invention, the first insulation layer and the second insulation layer are each formed of a substance selected from the group consisting of nitrogen compounds and silicon oxide.

In one embodiment of the invention, at least one of the pixel electrodes, the first electrode and the second electrode is formed of a transparent conductive layer.

In one embodiment of the invention, the first insulation layer includes a plurality of insulation layers formed of different substances.

In one embodiment of the invention, the second insulation layer includes a plurality of insulation layers formed of different substances.

In one embodiment of the invention, both of the first insulation layer and the second insulation layer includes a plurality of insulation layers formed of different substances.

In one embodiment of the invention, the pixel electrode is formed of a substance selected from the group consisting of Al, Ag, Cr, Ni, Cu, Ti and alloys thereof.

In one embodiment of the invention, the second insulation layer has a corrugated surface.

In one embodiment of the invention, the second insulation layer is formed of a color photoresist.

In one embodiment of the invention, the display medium is a liquid crystal.

In one embodiment of the invention, the display medium is a White-Taylor guest-host liquid crystal.

In one embodiment of the invention, the display apparatus further includes a plurality of insulation layers on the first substrate for supplying the first substrate with an insulating property.

In another aspect of the invention, a method for producing a display apparatus including a two-terminal element includes: step (a) of forming a conductive layer on an insulating substrate; step (b) of patterning the conductive layer into a specified pattern so as to form a scanning layer having a first electrode; step (c) of forming a zinc sulfide layer entirely on the substrate to cover the scanning line, the zinc sulfide layer having such a specified thickness as to have an I-V characteristic expressed by a continuous curve;

step (d) of forming a second electrode on the zinc sulfide layer, the second electrode being superimposed over at least a portion of the first electrode; step (e) of forming a pixel electrode on the zinc sulfide layer in such a pattern as to be electrically connected to the second electrode. The two-terminal element includes the first electrode, the zinc sulfide layer, and the second electrode.

In one embodiment of the invention, steps (d) and (e) are performed simultaneously, and the second electrode and the pixel electrode are formed by patterning another second conductive layer.

In one embodiment of the invention, the method further includes at least one of step (f) of forming a first insulation layer on the substrate between step (b) and step (c); and step (g) of forming a second insulation layer on the substrate between step (c) and step (d).

In one embodiment of the invention, step (g) includes step (h) of forming a hole for electrically connecting the second electrode and the zinc sulfide layer in the second insulation layer, the hole being formed by a photolithographic method, by which light is radiated toward the substrate from the side of a surface thereof having no scanning line and using the scanning line as a mask.

In one embodiment of the invention, the zinc sulfide layer is heated between step (c) and step (d) at a temperature which is higher than the temperature of the substrate for forming the zinc sulfide layer in step (c).

In one embodiment of the invention, the zinc sulfide layer is heated after step (d) at a temperature which is higher than the temperature of the substrate for forming the zinc sulfide layer in step (c).

In one embodiment of the invention, the zinc sulfide layer is heated between step (c) and step (g) at a temperature which is higher than the temperature of the substrate for forming the zinc sulfide layer in step (c).

In one embodiment of the invention, the zinc sulfide layer is heated in an atmosphere selected from the grope consisting of a vacuum atmosphere and a sulfur atmosphere.

In one embodiment of the invention, an impurity is implanted into the zinc sulfide layer in step (c).

In one embodiment of the invention, the impurity is selected from the group consisting of manganese, copper, rare earth elements, compounds including a rare earth element, and the III-group elements.

In one embodiment of the invention, the zinc sulfide layer is formed so as to have a composition ratio expressed by $1>x>0.5$ where the zinc sulfide layer has a composition expressed by $Zn_xS_{(1-x)}$.

In one embodiment of the invention, at least one of the pixel electrodes, the first electrode and the second electrode is formed of a transparent conductive layer.

In one embodiment of the invention, the pixel electrode is formed of a substance selected from the group consisting of Al, Ag, Cr, Ni, Cu, Ti and alloys thereof.

In one embodiment of the invention, the zinc sulfide layer has a thickness of 10 nm to 1 μm.

In still another aspect of the invention, a method for producing a display apparatus including a two-terminal element includes step (a) of forming a conductive layer on an insulating substrate; step (b) of patterning the conductive layer into a specified pattern to form a scanning layer having a first electrode; step (c) of forming an insulation layer entirely on the substrate to cover the scanning line; step (d) of forming a hole reaching the first electrode at a specified position of the insulation layer in a specified shape by a photolithographic method; step (e) of forming a zinc sulfide layer on the first electrode in the hole, the zinc sulfide layer having such a specified thickness as to have an I-V characteristic expressed by a continuous curve; and step (f) of forming a pixel electrode on the insulation layer in such a pattern as to be electrically connected to the zinc sulfide layer. The two-terminal element includes the first electrode, the zinc sulfide layer and a part of the pixel electrode located on an area corresponding to the zinc sulfide layer.

In still another aspect of the invention, a method for producing a display apparatus including a two-terminal element includes step (a) of forming a first conductive layer on an insulating substrate; step (b) of patterning the first conductive layer into a specified pattern to form a scanning layer having a first electrode; step (c) of forming an insulation layer entirely on the substrate to cover the scanning line; step (d) of forming a photoresist on the insulation layer and performing exposure and development using a mask for regulating a position and a shape for the formation of a zinc sulfide layer; step (e) of etching the insulation layer using the photoresist as a mask in order to form a hole reaching the first electrode in the insulation layer; step (f) of forming the zinc sulfide layer on the first electrode in the hole, the zinc sulfide layer having such a specified thickness as to have an I-V characteristic expressed by a continuous curve; step (g) of forming a second conductive layer on the zinc sulfide layer; step (h) of removing the photoresist, a part of the zinc sulfide layer corresponding to the photoresist, and a part of the second conductive layer corresponding to the photoresist by a lift-off method so as to keep the zinc sulfide layer at the position regulated by the mask and to form a second electrode from the second conductive layer; and step (i) of forming a pixel electrode on the insulation layer in such a specified pattern as to be electrically connected to the second electrode. The two-terminal element includes the first electrode, the zinc sulfide layer and the second electrode.

In still another aspect of the invention, a method for producing a display apparatus including a two-terminal element includes step (a) of forming a conductive layer on an insulating substrate; step (b) of patterning the conductive layer into a specified pattern to form a scanning layer having a first electrode; step (c) of forming a zinc sulfide layer entirely on the substrate to cover the scanning line, the zinc sulfide layer having such a thickness as to have an I-V characteristic expressed by a continuous curve; step (d) of forming a photoresist on the zinc sulfide layer and removing a part of the zinc sulfide layer and a part of the photoresist corresponding to an area other than a specified area on the first electrode; step (e) of forming an insulation layer entirely on the substrate to cover the photoresist and the zinc sulfide layer; step (f) of removing the photoresist and a part of the insulation layer on the photoresist by a lift-off method; and step (g) of forming a pixel electrode on the insulation layer in such a specified pattern as to be electrically connected to the zinc sulfide layer. The two-terminal element includes the first electrode, the zinc sulfide layer and a part of the pixel electrode on the specified area.

In still another aspect of the invention, a method for producing a display apparatus including a two-terminal element includes step (a) of forming a first conductive layer on an insulating substrate; step (b) of patterning the first conductive layer into a specified pattern to form a scanning layer having a first electrode; step (c) of forming a zinc sulfide layer entirely on the substrate to cover the scanning line, the zinc sulfide layer having such a thickness as to have an I-V characteristic expressed by a continuous curve; step (d) of forming a second conductive layer on the zinc sulfide layer; step (e) of forming a photoresist on the second conductive layer and performing exposure and development using a mask for regulating a position and a shape for the formation of a zinc sulfide layer; step (f) of removing the photoresist, a part of the zinc sulfide layer corresponding to the photoresist, and a part of the second conductive layer corresponding to the photoresist by a lift-off method to keep the zinc sulfide layer at the position regulated by the mask and to form a second electrode from the second conductive layer; and step (g) of forming an insulation layer entirely on the substrate so as to cover the photoresist and the zinc sulfide layer; step (h) of removing the photoresist and a part of the insulation layer on the photoresist by a lift-off method; and step (i) of forming a pixel electrode on the insulation layer in such a specified pattern as to be electrically connected to the second electrode. The two-terminal element includes the first electrode, the zinc sulfide layer and the second electrode.

Thus, the invention described herein makes possible the advantages of (1) providing a display apparatus having an excellent I-V characteristic, the few defects in pixels, and high uniformity of the display quality; and (2) a highly reliable display apparatus and a method for producing the same which solves the problem of insulation breakdown due to insufficient insulation of a tapered side portion of a first metal layer by an active layer.

These and other advantages of the present invention will become apparent to those skilled in the art upon reading and understanding the following detailed description with reference to the accompanying figures.

BRIEF DESCRIPTION OF THE DRAWINGS

FIG. 20(a)–20(g) is a schematic illustration of a part of a process for producing the LCD apparatus shown in FIG. 18 and 19 in the tenth example;

FIG. 21(a)–21(g) is a schematic illustration of a part of a process for producing the LCD apparatus shown in FIGS. 18 and 19 in the eleventh example;

FIG. 23(a)–23(h) is a schematic illustration of a part of a process for producing the LCD apparatus shown in FIG. 22 in the twelfth example;

FIG. 24(a)–24(h) a schematic illustration of a part of a process for producing the LCD apparatus shown in FIG. 22 in the thirteenth example;

DESCRIPTION OF THE PREFERRED EMBODIMENTS

A display apparatus according to the present invention includes a two-terminal device having an active layer formed of a thin zinc sulfide (ZnS) film. The nonlinearity in the electric resistance of the active is utilized for display. It is known that there are mainly two types of I-V characteristic: the Poole-Frenkel characteristic and the switching characteristic. The switching characteristic indicates a high resistance state and a low resistance state. The Poole-Frenkel characteristic is described in H. Murry, Thin Solid Films 22 (1974) 37, and the switching characteristic is described in Masahiro Fukuzawa, Applied Physics Vol. 46, No. 7 (1977).

Figure 31:
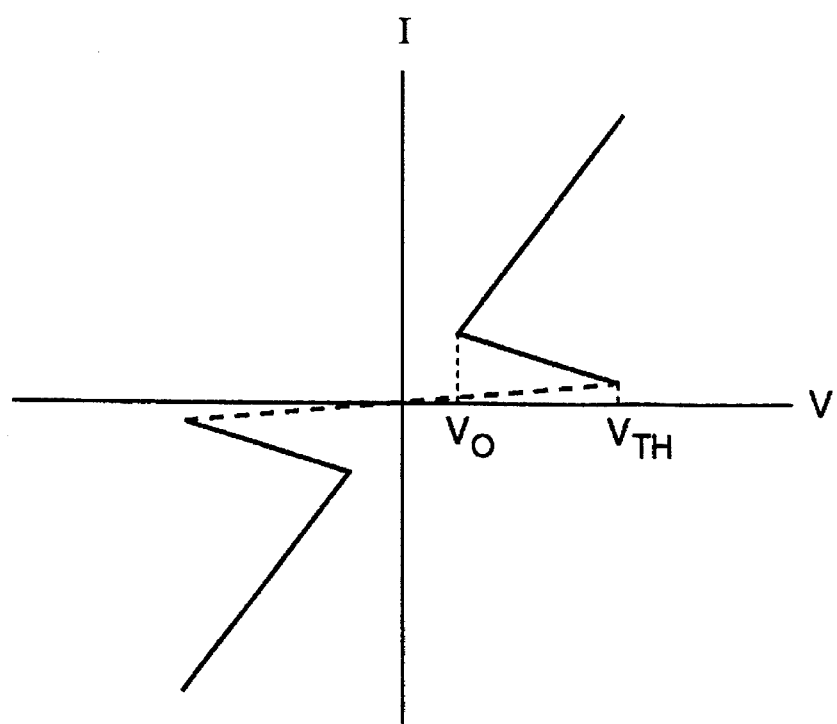
FIG. 31 is a graph illustrating a curve representing the I-V characteristic of ZnS film used in a conventional display apparatus.

FIG. 31 is a graph illustrating a curve representing the I-V characteristic of the ZnS film which indicates the switching characteristic. As is apparent from FIG. 31, the resistance of the ZnS film drastically changes at a threshold level of the applied voltage $V_{TH}$, and thus the curve representing the I-V characteristic is discontinuous. As applied voltage is increased, at the threshold level of the voltage $V_{TH}$, the current begins to flow and the voltage decreases to a certain level ($V_O$). And then the current starts to increase proportionally to the applied voltage. The curve has slopes in opposite inclination. The I-V characteristic curve has different values of current I corresponding to the same value of voltage V between $V_O$ and $V_{TH}$. The I-V characteristic of the ZnS around the threshold level of the applied voltage is extremely unstable and is not reliable. A film having such an I-V characteristic is not suitable for a display apparatus.

By controlling a condition of the ZnS film, an I-V characteristic showing a continuous curve can be obtained. In this specification, continuous means that the curve has a continuous slope in which the inclination increases or decreases but does not change to the opposite direction.

Figure 4:
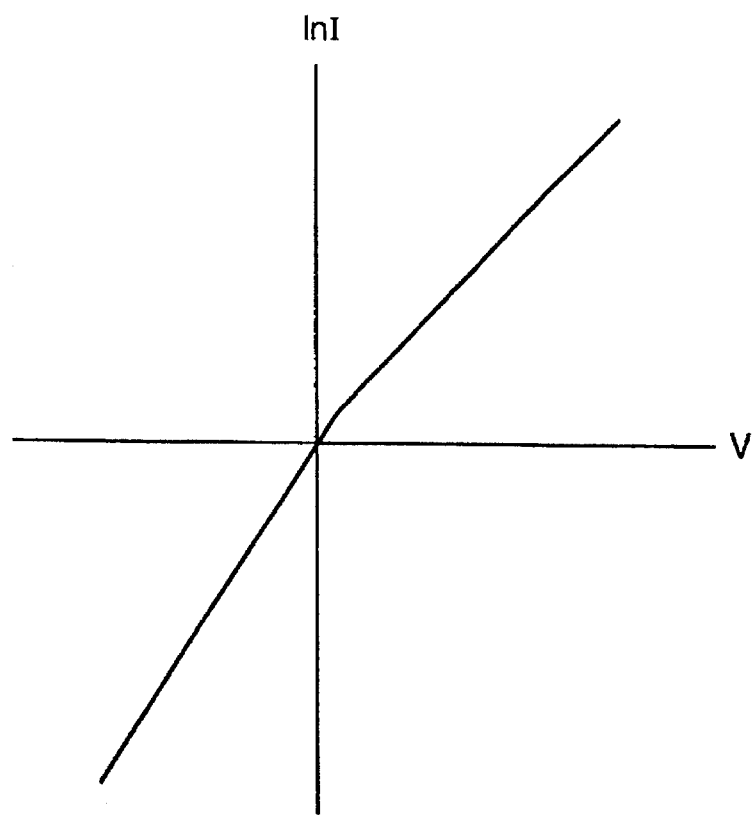
FIG. 4 is a graph illustrating a curve representing the I-V characteristic of a two-terminal device used in the LCD apparatus in the first example.

FIG. 4 shows a curve representing the I-V characteristic of a ZnS film used in a display apparatus according to the present invention. In the present invention, a ZnS thin film which realizes an I-V characteristic showing a continuous curve is used, and therefore the I-V characteristic is stable even around the threshold level of the applied voltage. Moreover, the I-V characteristic of the ZnS film is better in steepness than that of the insulation layer (active layer) formed of $Ta_2O_5$ or $SiN_x$. This means that the ZnS film used in the present invention is suitable for the switching device.

In FIG. 4, parts of the curve representing the I-V characteristic in two quadrants corresponding to the positive valves of the voltage V and the negative values of the voltage V are highly symmetrical to each other. Such symmetry is important for realizing high quality images in an AC-driven LCD apparatus.

Hereinafter, the present invention will be described by way of illustrative examples with reference to the accompanying drawings.

EXAMPLE 1

A first example of a display apparatus according to the present invention will be described with reference to FIGS. 1 through 5.

Figure 1:
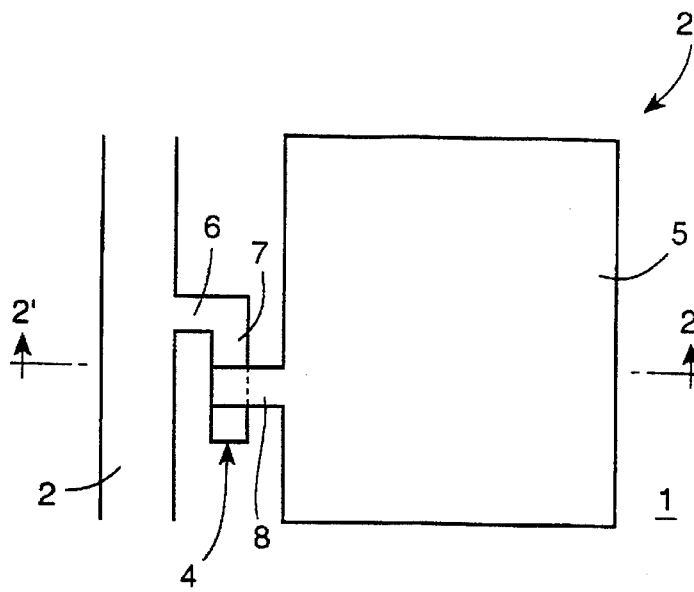
FIG. 1 is a partial top view of an LCD apparatus in a first example according to the present invention.
Figure 2:
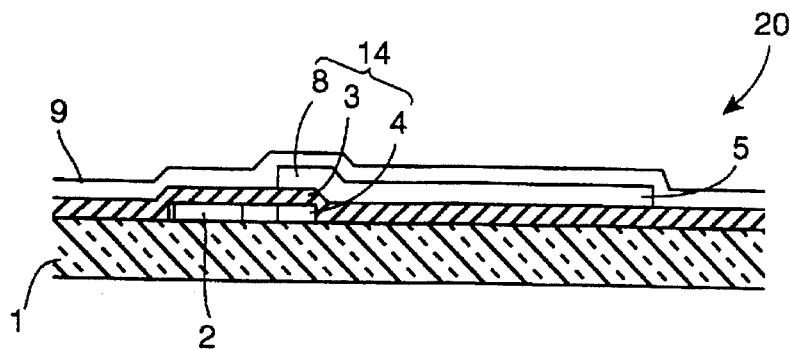
FIG. 2 is a cross sectional view of the display apparatus illustrated in FIG. 1 looking along section line 2'—2' in FIG. 1.

FIGS. 1 and 2 show a part of an LCD apparatus 20 in the first example according to the present invention. FIG. 1 is a top view of a rectangular pixel electrode 5 and a vicinity thereof in the LCD apparatus 20; and FIG. 2 is a cross sectional view of the LCD apparatus 20 shown in FIG. 1 looking along section line 2'—2' in FIG. 1.

As is shown in FIG. 1, the LCD apparatus 20 includes an insulating base substrate 1 formed of glass or the like. A plurality of pixel electrode 5 (only one is shown in FIG 1) are arranged in a matrix on a top surface of the base substrate 1. A plurality of scanning lines 2 (only one is shown in FIG. 1) respectively corresponding to the pixel electrodes 5 are also on the top surface of the base substrate 1, each for sending a timing signal to the corresponding pixel electrode 5 in order to drive the pixel electrode 5. Each pixel electrode 5 and the corresponding scanning line 2 are connected to each other by a switching element. According to the present invention, a two-terminal device including a ZnS layer is used as the switching device. The continuous and steep I-V characteristic of the ZnS layer is used.

A first electrode 4 is branched from the scanning line 2. The first electrode 4 includes a first section 6 extended perpendicularly to the scanning line 2 and a second section 7 extended perpendicularly to the first section 6. The second section 7 is parallel to the scanning line 2. A ZnS layer 3 formed of a thin ZnS film is on the entire top surface of the base substrate 1, covering the scanning line 2 and the first electrode 4. The pixel electrode 5 is on the ZnS layer 3 along the scanning line 2. As is illustrated in FIG. 2, a second electrode 8 is branched from the pixel electrode 5 in such a direction as to cross the second section 7 of the first electrode 4. The second electrode 8 partially covers the second section 7 of the first electrode 4 with the ZnS layer sandwiched therebetween. A two-terminal device 14 includes a three-layer structure including the first electrode 4, the ZnS layer 3 and the second electrode 8. An alignment film 9 is on the entire base substrate 1, covering the ZnS layer 3 and the pixel electrode 5.

Figure 3:
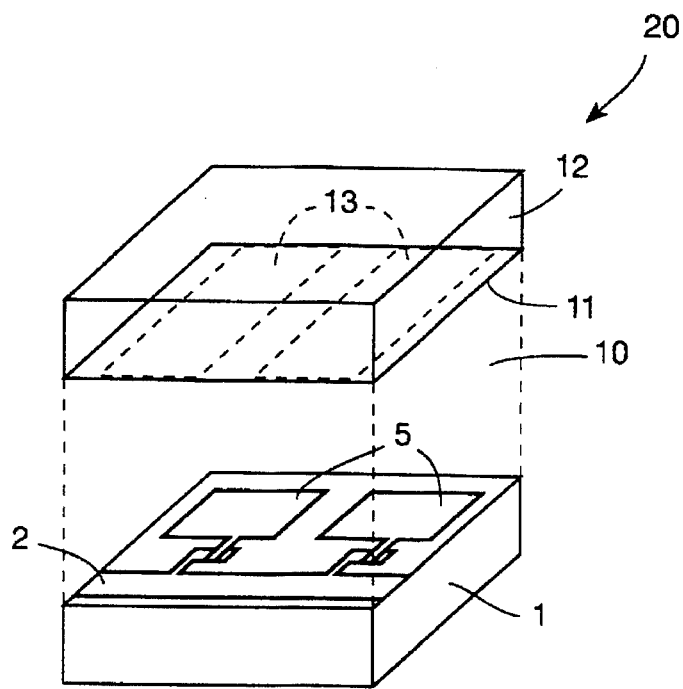
FIG. 3 is an isometric view of the display apparatus shown in FIGS. 1 and 2.

FIG. 3 is a partial isometric view of the display apparatus 20 shown in FIGS. 1 and 2. As is shown in FIG. 3, an insulating counter substrate 12 formed of glass or the like is opposed to the base substrate 1 with a liquid crystal layer 10 as a display medium sandwiched therebetween. A plurality of counter electrodes 13 are on the bottom surface of the counter substrate 12 facing the base substrate 1, the counter electrodes 13 being arranged in such a direction as to cross the scanning line 2. An alignment film 11 is on the entire bottom surface of the counter substrate 12, covering the counter electrodes 13.

The LCD apparatus 20 having the above-described structure is produced in the following manner.

On the insulating base substrate 1 formed of glass or the like, a conductive thin film formed of Ta is formed in a specified thickness (300 nm in the first example) by sputtering. The conductive thin film may be formed by CVD, evaporation or the like instead of sputtering.

As shown in FIG. 2, the conductive thin film formed of Ta is patterned into a specified pattern so as to form the scanning line 2 having the first electrode 4. The ZnS layer 3 is formed on the entire top surface of the base substrate 1 in a specified thickness by sputtering so as to cover the scanning line 2 and the first electrode 4. The thickness of the ZnS layer 3 is determined as follows based on the driving voltage for the LCD apparatus 20. Namely, the voltage which is necessary to cause liquid crystal molecules in the liquid crystal layer 10 as the display medium to display an image.

When an electric field applied to the ZnS layer 3 reaches a certain level, the current suddenly flows in the ZnS layer 3. Such a specific level is referred to as the threshold level of the electric field (or withstand voltage). The threshold voltage depends on the thickness of the ZnS layer 3. Accordingly, the thickness of the ZnS layer 3 is determined so that the voltage applied to the liquid crystal layer 10 will reach the driving voltage for display when the voltage applied to the ZnS layer 3 exceeds the threshold level. Namely, when the ZnS layer 3 as the switching device is turned "ON".

The threshold level of the electric field is in proportion to the thickness of the ZnS layer 3. Where the thickness is less than 10 nm, the I-V characteristic is unstable; and where the thickness is more than 1 µm, the steepness of the I-V characteristic declines. Accordingly, in order to obtain a stable and steep I-V characteristic, the thickness of the ZnS layer 3 should be between 10 nm and 1 µm, preferably 30 nm to 200 nm inclusive.

As the sputtering target, a highly pure, sintered ZnS target is used. Or, highly pure ZnS powders which are densely spread all over a quartz glass plate may be used. The sputtering is performed using argon (Ar) as the sputtering gas, at the substrate temperature of 250° C., with the gas pressure of 10 Pa and the input power of 750 W.

The ZnS layer 3 may be formed by CVD, evaporation or other thin film formation methods instead of sputtering. In the first example, the thickness of the ZnS layer 3 is 100 nm.

A conductive film for forming the pixel electrode 5 is formed on the ZnS layer 3. In the first example, an ITO film is formed by sputtering as the conductive film since ITO is suitable for a transmission type LCD apparatus due to the transparency thereof. The ITO film may be formed by CVD, evaporation or the like instead of sputtering.

For a reflection type LCD apparatus, the conductive film may be formed of metal such as Al, Ni, Ti, Ag, Cr, Cu and alloys thereof.

The ITO film is patterned into a specified pattern in order to form the pixel electrode 5 and the second electrode 8 which is extended in such a direction as to cross the second section 7 of the first electrode 4 of the scanning line 2.

The alignment film 9 is formed on the entire base substrate 1. In detail, the material for the alignment film 9 containing, for example, polyimide is formed on the entire base substrate 1, and then the material is cured and aligned.

As shown in FIG. 3, on the bottom surface of the counter substrate 12 to face the base substrate 1, an ITO film is formed and patterned so as to form a plurality of counter electrodes 13 corresponding to the plurality of pixel electrodes 5, respectively. The counter electrodes 13 are arranged substantially in parallel to one another. Each counter electrode 13 has a width sufficient to cover the corresponding pixel electrode 5. Then, the alignment film 11 is formed on the entire bottom surface of the counter substrate 12. In detail, a material for the alignment film 11 is formed on the entire bottom surface of the counter substrate 12 so as to cover the counter electrodes 13. The material is cured and then aligned.

The base substrate 1 having the scanning lines 2, the pixel electrodes 5 and the like on the top surface thereof and the counter substrate 12 having the counter electrodes 13 and the like on the bottom surface thereof are assembled with spacers (not shown) sandwiched therebetween so that the top surface of the base substrate 1 and the bottom surface of the counter substrate 12 face each other and so that the scanning lines 2 and the counter electrodes 13 are arranged in such directions as to cross each other.

The liquid crystal is injected between the base substrate 1 and the counter substrate 12 to form the liquid crystal layer 10, and then the liquid crystal layer 10 is sealed.

The LCD apparatus 20 produced in the above-described manner operates in the following way.

Figure 5:
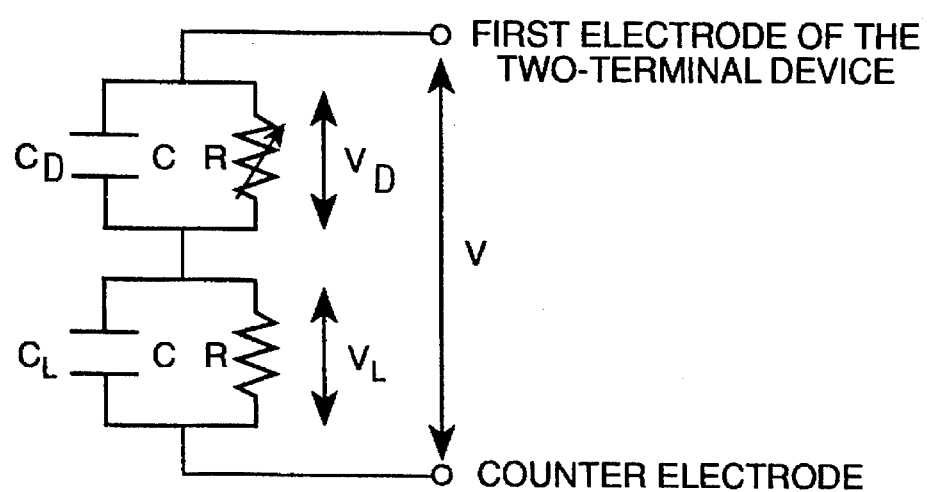
FIG. 5 is an equivalent circuit diagram corresponding to one pixel of the LCD apparatus in the first example.

As is mentioned above, FIG. 4 is a graph illustrating the curve representing the I-V characteristic of a two-terminal device used in the present invention, for example, the two-terminal device 14. The current I is represented in logarithmic scale in FIG. 4. FIG. 5 is an equivalent circuit diagram corresponding to one pixel of an LCD apparatus including the two-terminal device, for example, the LCD apparatus 20.

As is shown in FIG. 5, the two-terminal device 14 has a capacitance $C_D$, and the liquid crystal layer has a capacitance $C_L$. The pixel is equivalent to a circuit including the capacitances $C_D$ and $C_L$ connected with each other in series between the first electrode 4 and the counter electrode 13.

When a voltage is applied to two ends of the LCD apparatus 20, namely, to the first electrode 4 and to the counter electrode 13, a voltage $V_D$ applied to the two-terminal device 14 is expressed by Equation (4). In other words, the voltage $V_D$ is obtained by capacitance-dividing of the voltage V.

$$V_D = V \cdot C_L / (C_L + C_D) \tag{4}$$

A voltage $V_L$ applied to the capacitance of the liquid crystal layer 10 is expressed by Equation (5).

$$V_L = V \cdot C_D / (C_L + C_D) \tag{5}$$

It is apparent from Equation (4) that, when $C_L \gg C_D$, $V_D$ is approximately equal to V. Accordingly, the voltage $V_D$ at a sufficient level is applied to the two-terminal device 14. When the voltage $V_D$ applied to the two-terminal device 14 exceeds the threshold voltage $V_{TH}$ of the two-terminal device 14, the two-terminal device 14 is turned ON.

When the two-terminal device 14 is ON, the voltage $V_L$ expressed by Equation (5) is applied to the liquid crystal layer 10, and thus an electrical charge is stored in the capacitance $C_L$ of the liquid crystal layer 10.

When the voltage $V_D$ applied to the two-terminal device 14 is decreased to below the threshold voltage $V_{TH}$ of the two-terminal device 14, the two-terminal device 14 is turned OFF. Even when the two-terminal device 14 is OFF, the liquid crystal molecules are driven by the electric charge stored in the capacitance $C_L$ of the liquid crystal layer 10 when the two-terminal device 14 is ON.

EXAMPLE 2

Figure 6:
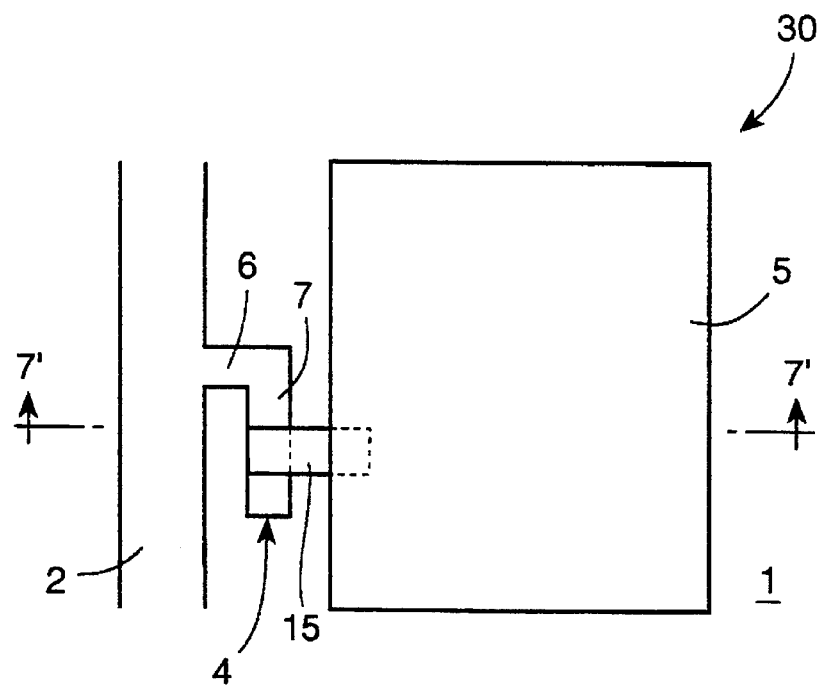
FIG. 6 is a partial top view of an LCD apparatus in a second example according to the present invention.
Figure 7:
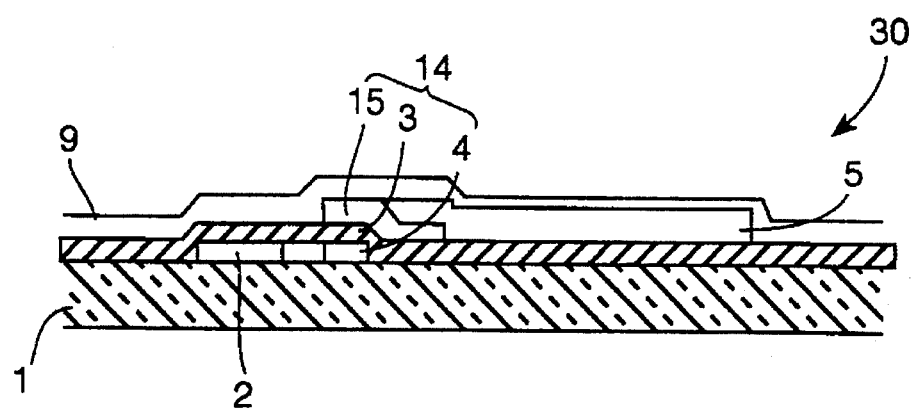
FIG. 7 is a cross sectional view of the LCD apparatus shown in FIG. 6 looking along section line 7'—7' in FIG. 6.

Referring to FIGS. 6 and 7, a second example of a display apparatus according to the present invention will be described. In this and all the following examples, identical elements as those in the first example bear identical reference numerals therewith for simplicity.

FIGS. 6 and 7 show a part of an LCD apparatus 30 in the second example according to the present invention. FIG. 6 is a top view of a rectangular pixel electrode 5 and a vicinity thereof in the LCD apparatus 30; and FIG. 7 is a cross sectional view of the LCD apparatus 30 shown in FIG. 6 looking along section line 7'—7' in FIG. 6.

The structure of the LCD apparatus 30 in the second example is identical with the structure of the LCD apparatus 20 in the first example except that a second electrode 15 formed of metal is provided independently instead of being extended from the pixel electrode 5.

The second electrode 15 is on the second section 7 of the first electrode 4 with the ZnS layer 3 sandwiched therebetween. The pixel electrode 5 is on the ZnS layer 3, covering an end portion of the second electrode 15. The two-terminal device 14 includes the three-layer structure including the first electrode 4, the ZnS layer 3 and the second electrode 15. Due to such a structure, the ZnS layer 3 and the second electrode 15 are electrically connected to each other.

In the second example, the process for producing the LCD apparatus 30 requires the step of forming the second electrode 15 in addition to the production process of the LCD apparatus 20 described in the first example. However, since the second electrode 15 and the pixel electrode 5 are formed of different materials from each other, the materials for the second electrode 15 and the pixel electrode 5 can be chosen from a wider selection of materials than in the first example.

EXAMPLE 3

In a third example according to the present invention, the ZnS layer 3 is formed by sputtering using a different target from the target used in the first and the second examples. The target used in the third example is obtained by doping manganese (Mn) in the sintered ZnS target. The target may be obtained by mixing Mn in highly pure ZnS powders and then densely spreading the resultant mixture all over a quartz glass plate. In this manner, Mn is implanted into the ZnS layer 3.

Implantation of Mn into the ZnS layer 3 improves the withstand voltage of the ZnS layer 3 and thus enhances the reliability of the two-terminal device 14. Except for the material for the sputtering target, the LCD apparatus in the third example is identical with the LCD apparatuses in the first and the second examples.

Instead of Mn, other materials may be used. For example, copper, rare earth elements such as terbium (Tb), samarium (Sm), europium (Eu), or oxides, fluorides, carbonates, phosphates, oxalates, chlorides, bromides, iodides, nitrates or other compounds of such rare earth elements may be used. By mixing powders of these elements or compounds with the ZnS powders, at least one of these elements or compounds is implanted into the ZnS layer 3. In this manner, the withstand voltage of the ZnS layer 3 is improved, and thus the reliability of the two-terminal device 14 is enhanced.

The two-terminal device in the third example has an I-V characteristic excellent in steepness and symmetry.

EXAMPLE 4

In a fourth example according to the present invention, the ZnS layer 3 is formed by sputtering using a different target from the target used in the previous three examples. The target used in the fourth example is obtained by doping Al in the sintered ZnS target. The target may be obtained by mixing Al powders in highly pure ZnS powders and then densely spreading the resultant mixture all over a quartz glass plate. In this manner, Al is implanted into the ZnS layer 3.

Figure 8:
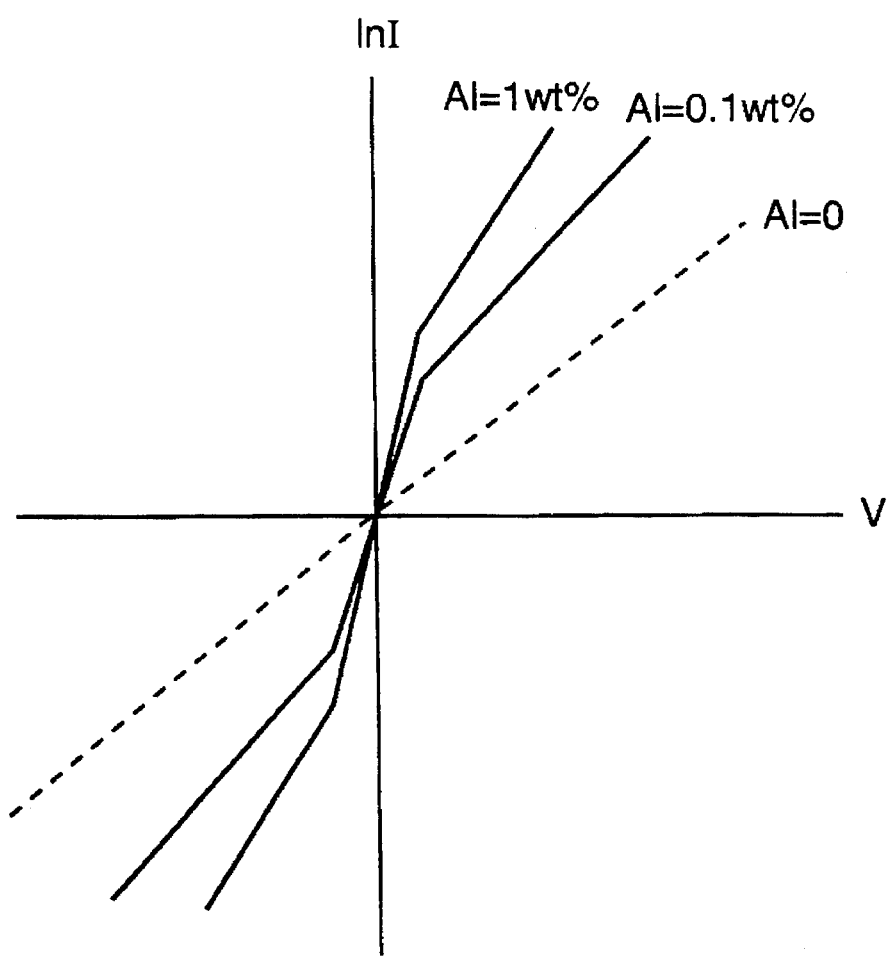
FIG. 8 is a graph illustrating curves representing the I-V characteristic of the zinc sulfide (ZnS) layers including aluminum (Al) in various weight ratios in an LCD apparatus in a fourth example according to the present invention.

FIG. 8 illustrates curves representing the I-V characteristic of the ZnS layers 3 including Al in various weight ratios. As is apparent from FIG. 8, the I-V characteristic can be changed by the amount of Al included in the ZnS layer 3. As the amount of Al increases, the I-V characteristic increases in steepness.

Except for the material for the sputtering target, the LCD apparatus in the fourth example is identical with the LCD apparatuses in the previous three examples.

Instead of Al, other III-group elements may be included in the ZnS layer 3 by implantation into the ZnS powders and the same effects can be obtained.

As is mentioned above, the I-V characteristic of the ZnS layer 3 can easily be changed by varying the amount of Al or other III-group elements included in the ZnS layer 3. Utilizing this fact, a two-terminal device having an optimum I-V characteristic can be obtained in accordance with the electrooptic properties of the display medium used in an LCD apparatus to be produced.

EXAMPLE 5

In a fifth example according to the present invention, the ZnS layer 3 is formed by sputtering using a different target from the target used in the previous four examples. The target used in the fifth example is obtained by doping Zn in the sintered ZnS target. In this manner, the composition ratio of Zn and sulfur (S) in the ZnS layer 3 can be changed.

Figure 9:
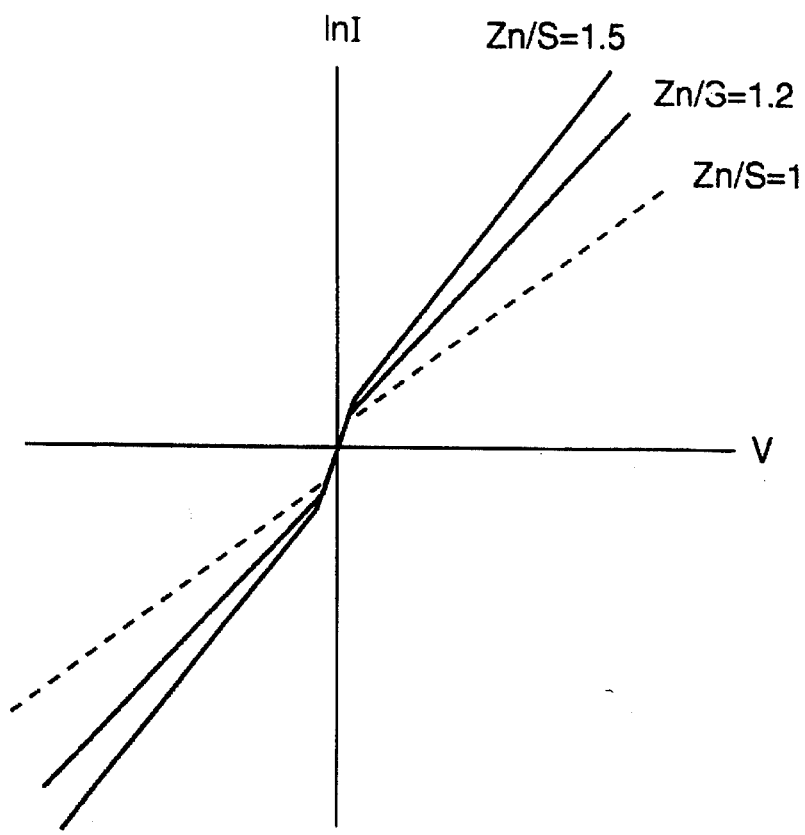
FIG. 9 is a graph illustrating curves representing the I-V characteristic of the ZnS layers with various composition ratios of Zn and S in an LCD apparatus in a fifth example according to the present invention.

FIG. 9 illustrates curves representing the I-V characteristic of the ZnS layers 3 including Zn in various composition ratios with respect to S. As is apparent from FIG. 9, the I-V characteristic can be changed by varying the composition ratio of Zn to S in the ZnS layer 3. As the composition ratio of Zn increases, the I-V characteristic increases in steepness.

Except for the material for the sputtering target, the LCD apparatus in the fifth example is identical with the LCD apparatuses in the previous four examples.

As is mentioned above, the I-V characteristic of the ZnS layer 3 can easily be changed by varying the composition ratio of Zn to S included in the ZnS layer 3. Utilizing this fact, a two-terminal device having an optimum I-V characteristic can be obtained in accordance with the electrooptic properties of the display medium used in an LCD apparatus to be produced.

EXAMPLE 6

Referring to FIGS. 10 through 13, a sixth example of a display apparatus according to the present invention will be described.

Figure 10:
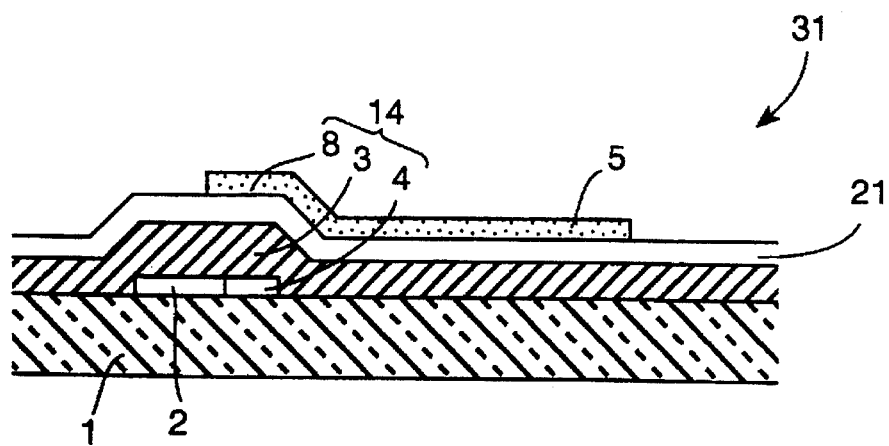
FIG. 10 is a cross sectional view of an LCD apparatus in a sixth example according to the present invention.

FIG. 10 is a cross sectional view of an LCD apparatus 31 in the sixth example according to the present invention. In the two-terminal device 14 in the LCD apparatus 31, an insulation layer 21 is sandwiched between the ZnS layer 3 (active layer) and the second electrode 8 of the pixel electrode 5. The insulation layer 21 is formed of $SiN_x$ by sputtering on the entire base substrate 1. The pixel electrode 5 having the second electrode 8 is formed on the insulation layer 21.

By such a structure, the withstand voltage of the two-terminal device 14 is improved, and thus the reliability of the two-terminal device 14 is enhanced.

The insulation layer 21 may be formed of any insulating material, preferably a nitrogen compound such as $SiN_x$ or AlN.

The production process of the LCD apparatus 31 is identical with the production process described in the first example until the ZnS layer 3 is formed. After the formation of the ZnS layer 3, the insulation layer 21 is formed on the entire ZnS layer 3 by sputtering, using silicon as a sputtering target under an atmosphere of a mixture gas of Ar and $N_2$, at the substrate temperature of 250° C., the gas pressure of 8 Pa and the input power of 750 W.

On the insulation layer 21, the pixel electrode 5 is formed. After that, the production process of the LCD apparatus 31 is again identical with the process described in the first example.

Figure 11:
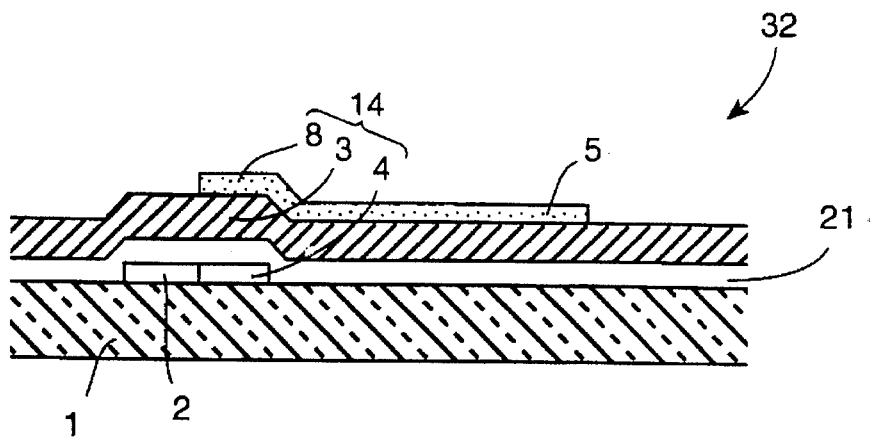
FIG. 11 is a cross sectional view of a modification of the LCD apparatus in the sixth example.

FIG. 11 is a cross sectional view of an LCD apparatus 32 as a modification of the LCD apparatus 31. In the LCD apparatus 32, the insulation layer 21 is sandwiched between the first electrode 4 and the ZnS layer 3.

Figure 12:
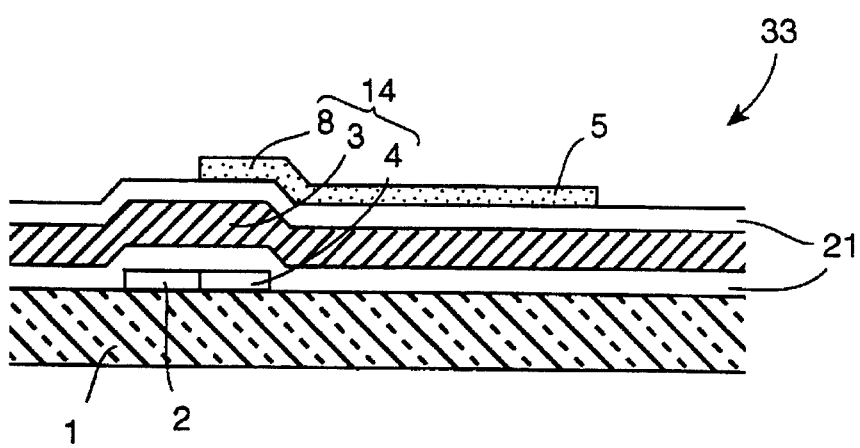
FIG. 12 is a cross sectional view of another modification of the LCD apparatus in the sixth example.

FIG. 12 is a cross sectional view of an LCD apparatus 33 as another modification of the LCD apparatus 31. In the LCD apparatus 33, an insulation layer 21 is sandwiched between the first electrode 4 and the ZnS layer 3, and another insulation layer 21 is sandwiched between the ZnS layer 3 and the second electrode 8.

Figure 13:
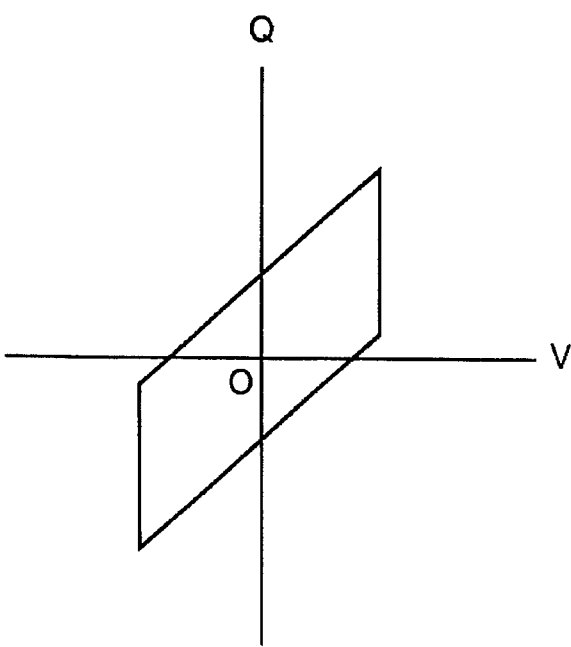
FIG. 13 is a graph illustrating a curve representing the Q-V characteristic of the LCD apparatus shown in FIG. 12.

The LCD apparatus 33 including the two-terminal device 14 having two insulation layers 21 is driven, utilizing the nonlinearity of the capacitance of the two-terminal device 14. FIG. 13 is a graph illustrating the curve representing the Q-V characteristic of the two-terminal device 14 of the LCD apparatus 33. As is apparent from FIG. 13, the Q-V characteristic is satisfactory both in steepness and symmetry.

As is mentioned above, the insulation layer 21 may be formed of any insulating material. In the LCD apparatus 33, the two insulation layers 21 are preferably formed of an identical material in order to obtain a satisfactory Q-V characteristic.

The insulation layer 21 may have a multiple layer structure instead of a single layer structure. For example, the insulation layer 21 may have a two-layer structure of $SiO_2$ and $SiN_x$, or have a three-layer structure of $SiO_2$, $Ta_2O_5$ and $SiN_x$. In the LCD apparatus 33, either one of the two insulation layers 21 sandwiching the ZnS layer 3 may include such a multiple layer structure. The two insulation layers 21 may both include a multiple layer structure. By such a structure, the withstand of the two-terminal device 14 is improved, and thus the reliability of the two-terminal device 14 is enhanced.

The ZnS layer 3 and the insulation layer 21 both transmit visible light. Therefore, there is no need to pattern the ZnS layer 3 and the insulation layer 21 to remove any part thereof corresponding to a display area (namely, an area except for the two-terminal device 14). Accordingly, the formation of the layers can be performed continuously by a thin film formation technology after the first electrode 4 is formed. Such continuous formation simplifies the production process and thus reduces the production cost.

EXAMPLE 7

In a seventh example according to the present invention, the ZnS layer 3 described in the first through sixth examples illustrated in, for example, FIGS. 2, 7 and 10 through 12 is heated. The heating temperature should be equal to or higher than the substrate temperature used for the formation of ZnS layer 3. The heating is performed in a vacuum oven, in the temperature range of 300° C. to 600° C. inclusive for 1 hour. Instead of the vacuum oven, an ordinary oven or a sulfur atmosphere may be used.

The ZnS layer 3 illustrated in FIGS. 2, 7 and 11 is heated before the formation of the pixel electrode 5 having the second electrode 8 or 15. The ZnS layer 3 may be heated after the formation of the pixel electrode 5 having the second electrode 8 or 15.

The ZnS layer 3 illustrated in FIG. 10 is heated before the insulation layer 21 is formed or after the pixel electrode 5 including the second electrode 8 is formed. The ZnS layer 3 illustrated in FIG. 12 is heated before the formation of the insulation layer 21 on the ZnS layer 3 or after the formation of the pixel electrode 5 having the second electrode 8.

By heating the ZnS layer 3, the crystallinity of the ZnS layer 3 is improved. Further, the elements and the compounds described in the third, fourth and fifth examples are dispersed into the ZnS layer 3 by such heating when these elements and the compounds are implanted into the ZnS layer 3, and thus the ZnS layer 3 is made uniform in quality. Accordingly, the uniformity of characteristics and the reliability of the two-terminal device 14 are enhanced.

An aging test of the two-terminal device 14 produced according to the production process described in the seventh example proves that the two-terminal device 14 in the seventh example has stable characteristics with less aging. An LCD apparatus including such a two-terminal device 14 has stable display characteristics.

EXAMPLE 8

In an eighth example according to the present invention, a two-terminal device 14 is produced in accordance with the production process described in the sixth example, and an LCD apparatus is also produced using such a two-terminal device 14.

As is shown in FIG. 10, the insulation layer 21 is formed on the ZnS layer 3, and the pixel electrode 5 having the second electrode 8 is formed on the insulation layer 21. The pixel electrode 5 is formed of a transparent conductive material such as ITO, and the insulation layer 21 is formed of a nitrogen compound.

As is mentioned in the seventh example, heating the ZnS layer 3 improves the characteristics of the two-terminal device 14 as the switching device. However, in the case that the pixel electrode 5 is formed of ITO and the insulation layer 21 is formed of an oxide such as $Ta_2O_5$ or $Y_2O_3$, heating the ZnS layer 3 at a high temperature oxidizes a part of the pixel electrode 5 in contact with the insulation layer 21 and thus increases the surface resistance of the pixel electrode 5 formed of ITO. In the eighth example, the insulation layer 21 is formed of a nitrogen compound in order to solve such an inconvenience. An LCD apparatus including such a two-terminal device 14 is produced in the same manner as that described in the first example.

It has been confirmed that the use of silicon oxide for the insulation layer 21 keeps the surface resistance of the pixel electrode 5 small even if the ZnS layer 3 is heated.

An aging test of the two-terminal device 14 formed in the eighth example proves that the two-terminal device 14 has stable characteristics with less aging as in the seventh example. The LCD apparatus including such a two-terminal device 14 also has stable display characteristics.

EXAMPLE 9

Figure 14:
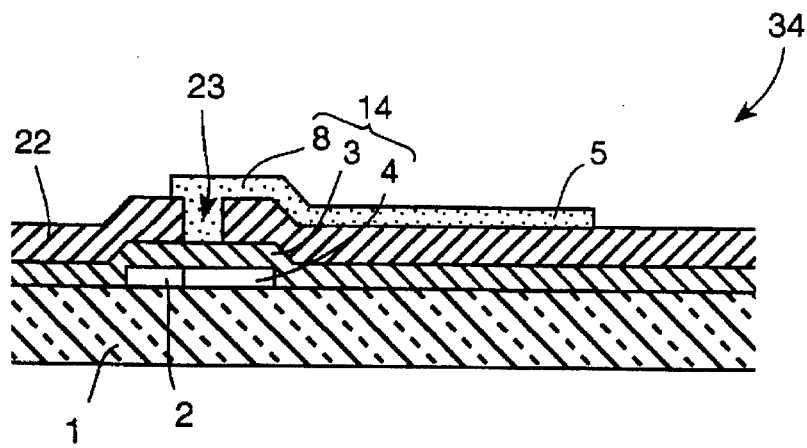
FIG. 14 is a partial cross sectional view of an LCD apparatus in a ninth example according to the present invention.

Referring to FIGS. 14 through 17, a ninth example of a display apparatus according to the present invention will be described. FIG. 14 is a cross sectional view of an LCD apparatus in a ninth example according to the present invention.

As is illustrated in FIG. 14, in an LCD apparatus 34 in the ninth example, an insulation layer 22 is sandwiched between the ZnS layer 3 and the pixel electrode 5 having the second electrode 8. The insulation layer 22 is formed by coating the ZnS layer 3 with a polymeric resin before forming the pixel electrode 5 having the second electrode 8. The insulation layer 22 also acts as a protection layer for the ZnS layer 3. The insulation layer 22 has a hole 23, and the hole 23 is filled with the second electrode 8. The ZnS layer 3 and the second electrode 8 are electrically connected with each other through the hole 23. Except for the insulation layer 22, the LCD apparatus 34 is identical in structure with the LCD apparatuses described in the first through the fifth examples.

The LCD apparatus 34 shown in FIG. 14 is produced in the following manner.

The production process of the LCD apparatus 34 is identical with the production process described in the first example until the ZnS layer 3 is formed. After the formation of the ZnS layer 3, the ZnS layer 3 is coated with a polymeric resin using a spinner, a roller coater or the like to form the insulation layer 22. The insulation layer 22 formed of a polymeric resin protects the ZnS layer 3 without influencing electric characteristics of the two-terminal device 14 of the LCD apparatus 34. Inorganic substances such as $SiO_2$ or $Al_2O_3$ and organic substances such as acrylic resins, polyimide or polyurea may be used for a protection layer for the ZnS layer 3 instead of a polymeric resin.

After the formation of the insulation layer 22, the hole 23 is formed in the insulation layer 22, at a portion thereof corresponding to the first electrode 4 by a photographic method. Then, the pixel electrode 5 having the second electrode 8 is formed in such a pattern that the second electrode 8 fills the hole 23. As is mentioned above, the ZnS layer 3 and the second electrode 8 (or the pixel electrode 5) are electrically connected with each other through the hole 23.

Figure 16:
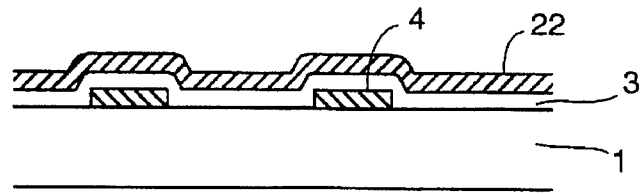
FIG. 16(a)–16(f) is a schematic illustration of a part of a process for producing the LCD apparatus illustrated in FIG. 14.
Figure 16:
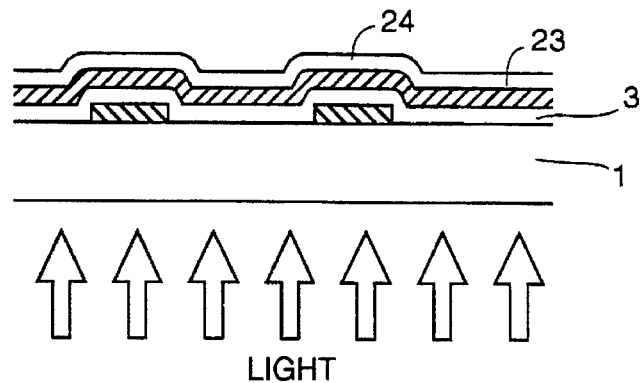
Figure 16:
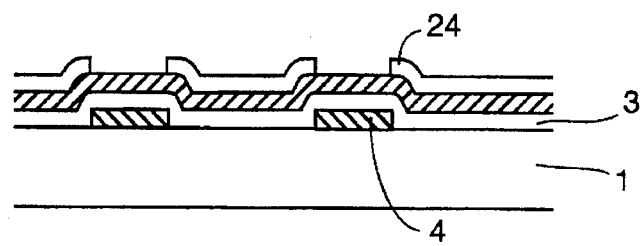
Figure 16:
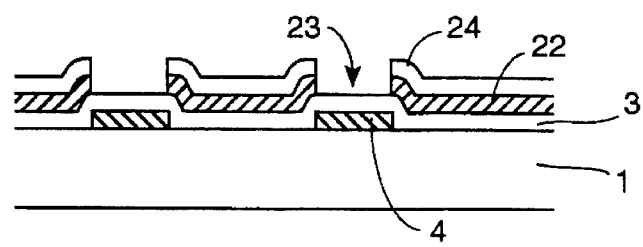
Figure 16:
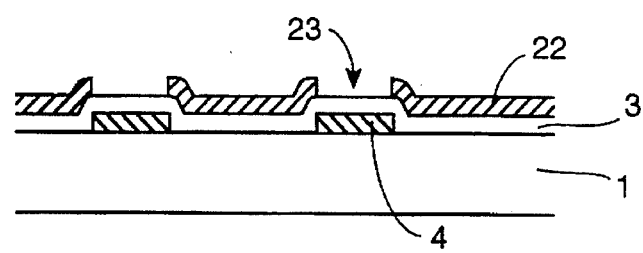
Figure 16:
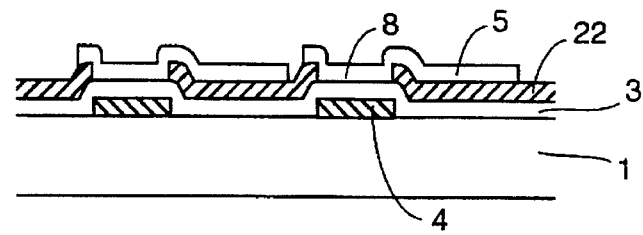

FIG. 16 is a schematic illustration of the process for forming the hole 23.

After the insulation layer 22 is formed on the ZnS layer 3 (part (a)), the insulation layer 22 is coated with a negative photoresist 24, and the resultant lamination is exposed to light from the side of a bottom surface of the base substrate 1, using the first electrode 4 as a mask (part (b)). Then, a part of the negative photoresist 24 shielded from the light by the first electrode 4 is removed by development and patterning (part (c)). A part of the insulation layer 22 corresponding to the first electrode 4 is removed in accordance with the pattern of the photoresist 24 to form the hole 23 (part (d)). Then, the photoresist 24 is peeled off (part (e)), and the pixel electrode 5 having the second electrode 8 is formed on the insulation layer 22 to fill the hole 23 (part (f)). The pixel electrode 5 is electrically connected to the ZnS layer 3 through the hole 23.

According to such a method, the insulation layer 22 is patterned to form the hole 23 in a self-alignment manner. Therefore, the hole 23 is formed at an appropriate position with no positional displacement. The production process is simple. As a result, a highly reliable two-terminal device 14 is produced with high efficiency.

An aging test of the two-terminal device 14 produced in the ninth example proves that the two-terminal device 14 has stable characteristics with little aging as in the seventh and the eighth examples. This is due to the insulation layer 22 formed of a polymeric resin. The LCD apparatus 34 including such a two-terminal device 14 also has stable characteristics.

Figure 17:
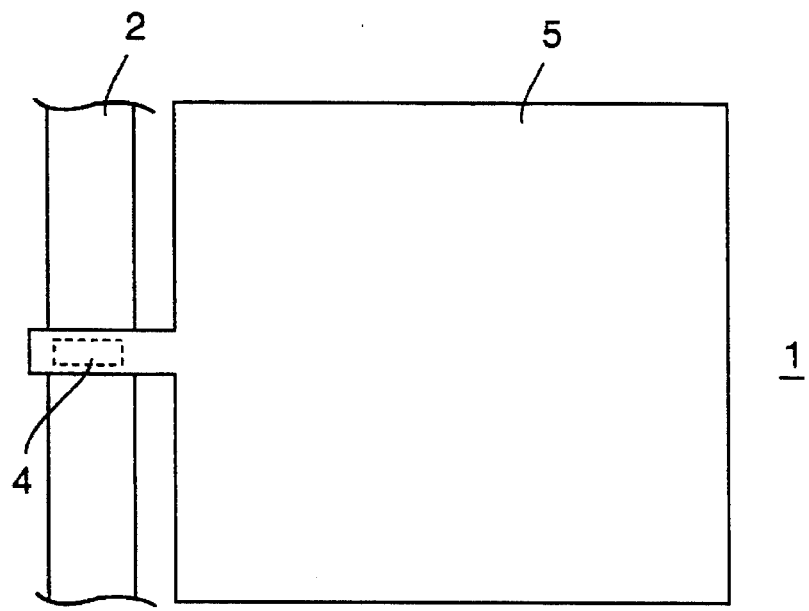
FIG. 17 is a top view of a modification of the LCD apparatus described in any one of the first through the ninth examples.

In the first through the ninth examples, the first electrode 4 is branched from the scannng line 2. Instead, a specified area within the scanning line 2 may be designated as the first electrode 4 as is illustrated in FIG. 17. In such a case, the two-terminal device 14 is formed by laminating the ZnS layer 3 (active layer) and the second electrode 8 on the first electrode 4 at the specified area within the scanning line 2.

Figure 15:
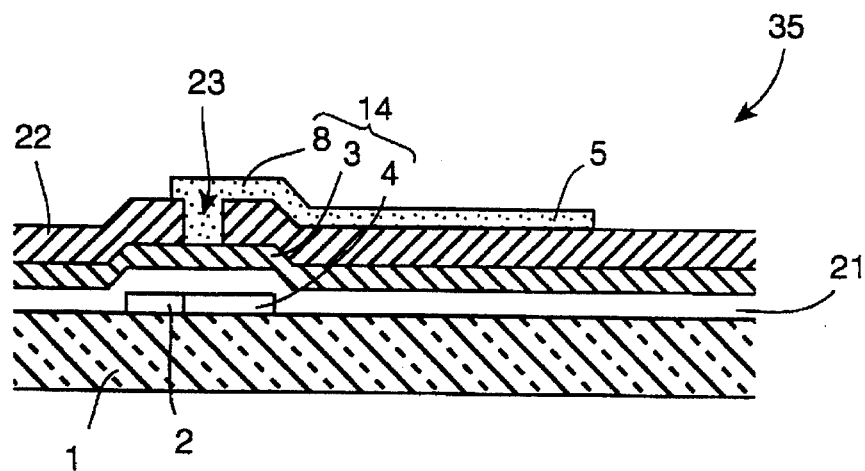
FIG. 15 is a partial cross sectional view of a modification of the LCD apparatus in the ninth example.

FIG. 15 is a cross sectional view of a modification of the LCD apparatus 34 in the ninth example. In an LCD apparatus 35 as the modification, the insulation layer 21 formed of $SiN_x$ or the like is sandwiched between the second electrode 4 and the ZnS layer 3 in addition to the insulation layer 22.

EXAMPLE 10

In a tenth example according to the present invention, a two-terminal device for a display apparatus and a method for producing the same for solving the problem of insufficient insulation of the first electrode 4 by the ZnS layer 3 will be described with reference to FIGS. 18 through 20.

Figure 18:
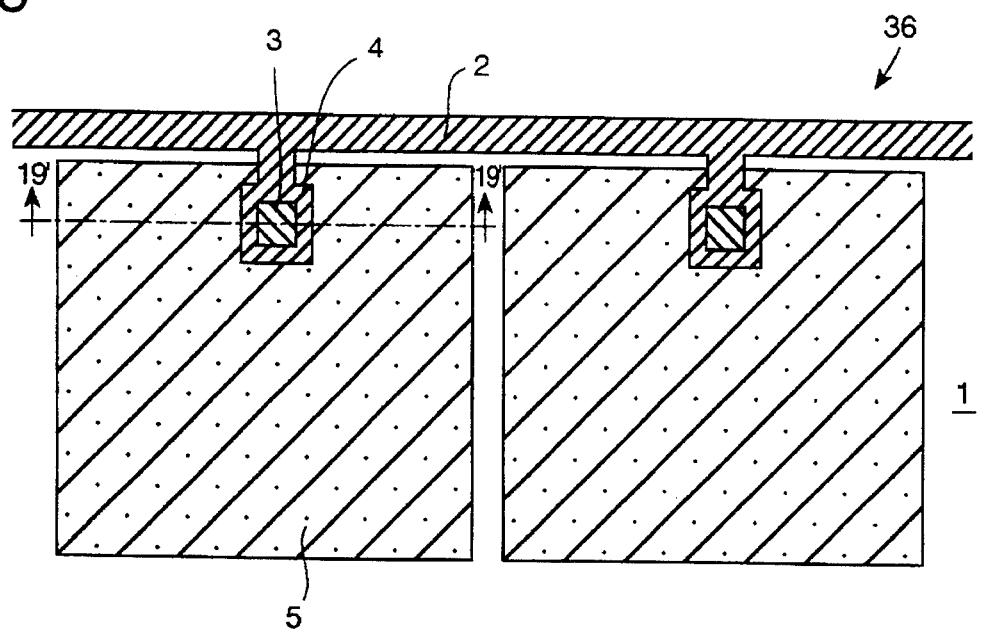
FIG. 18 is a partial top view of an LCD apparatus in a tenth and an eleventh examples according to the present invention.
Figure 19:
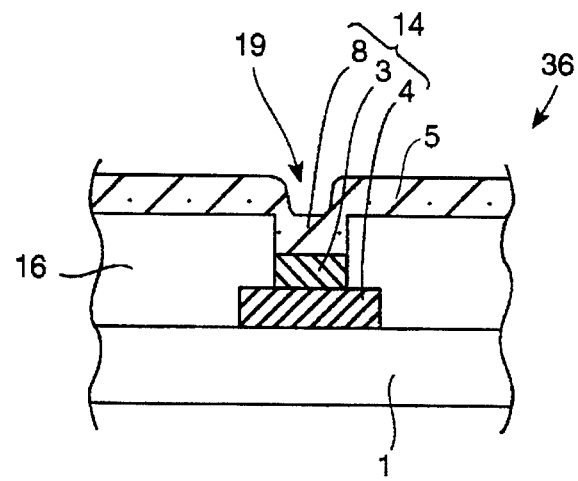
FIG. 19 is a cross sectional view of the LCD apparatus shown in FIG. 18 looking across section line 19'—19'.

FIG. 18 is a top view of two pixels and the vicinity thereof in an LCD apparatus 36 in the tenth example; and FIG. 19 is a cross sectional view of the LCD apparatus shown in FIG. 18 looking across section line 19'—19' in FIG. 18.

As is shown in FIG. 18, the LCD apparatus 36 includes the base substrate 1. The scanning line 2 is on the top surface of the base substrate 1, and the first electrode 4 is branched from the scanning line 2. The ZnS layer 3 acting as an active layer is on a specified area of the first electrode 4. It should be noted that the ZnS layer 3 is not on the entire base substrate 1. As is shown in FIG. 19, in a hole 19, an insulation layer 16 is on the base substrate 1, covering the first electrode 4 except for an the area on which the ZnS layer 3 is located. The insulation layer 16 has a greater thickness than that of the ZnS layer 3. The pixel electrode 5 is on the insulation layer 16, covering the ZnS layer 3. A part of the pixel electrode 5 which is on the ZnS layer 3 is the second electrode 8. The two-terminal device 14 includes the three-layer structure including the first electrode 4, the ZnS layer 3 and the second electrode 8.

The LCD apparatus 36 having the above-described structure is produced in the following manner.

FIG. 20 is a schematic illustration of a part of the process for producing the LCD apparatus 36.

First, a film of Ta is formed on the base substrate 1 in a specified thickness by sputtering and patterned into a specified pattern to form the scanning line 2 having the first electrode 4 (part (a)). The thickness of the scanning line 2 is 300 nm in the tenth example. The scanning line 2 having the first electrode 4 may be formed of a conductive thin film of titanium, molybdenum, aluminum, copper, ITO or the like instead of Ta. As an etchant for patterning, a mixed solution of hydrofluoric acid and nitric acid is used.

Then, the insulation layer 16 is formed as is illustrated in parts (b) through (d).

A film of $SiO_x$ is formed on the base substrate 1 to cover the first electrode 4 in a thickness of 1.0 μm (part (b)). Then, the film of $SiO_x$ is patterned into a specified pattern using a photoresist 17 and a mask 18 (parts (c) and (d)). In this way, the insulation layer 16 having a hole 19 at a portion corresponding to the two-terminal device 14 is formed. As the photoresist 17, a positive photoresist OFPR-800 produced by Tokyo Ohka Kabushiki Kaisha is used in the tenth example, but a negative photoresist may be used. The patterning after development is performed by dry etching. The insulation layer 16 may be formed of an insulating material such as $SiN_x$, $Al_2O_3$, are AlN instead of $SiO_x$.

Then, the ZnS layer 3 is formed on the photoresist 17 to cover the first electrode 4 by sputtering in a thickness of 200 nm (part (e)).

The photoresist 17 and the ZnS layer 3 on the photoresist 17 are peeled off by a lift-off method (part (f)) to keep the ZnS layer 3 only on the first electrode 4 in the hole 19. As the peeling-off liquid, OMR-710 produced by Tokyo Ohka Kabushiki Kaisha is used.

A film of ITO is formed on the insulation layer 16 to cover the ZnS layer 3 to a thickness of 200 nm, and patterned to form the pixel electrode 5 having the second electrode 8 (part (g)). The pixel electrode 5 having the second electrode 8 may be formed of a conductive material such as aluminum, tantalum, titanium, molybdenum or copper instead of ITO.

The two-terminal device 14 produced in the above-described manner includes a flat portion of the first electrode 4 but excludes a side portion and the vicinity thereof including an edge formed at the junction of a top surface 28 and a side surface 29 of the first electrode 4 and another edge formed at the junction of the side surface 29 and the interface between the first electrode 4 and the base substrate 1. Accordingly, insulation breakdown caused by insufficient insulation of the side portion of the first electrode 4 and the vicinity thereof by the insulation layer 16 does not influence the performance of the two-terminal device 14, and therefore a desirable I-V characteristic is obtained.

Since the ZnS layer 3 is formed only in the hole 19, namely, in the area of the two-terminal device 14, the inconveniences such as increase in the leak current and fluctuation in impedance in accordance with the change in the applied voltage caused by the ZnS layer 3 on the area other than the two-terminal device 14 can be avoided.

Further, since the insulation layer 16 covers the entire top surface of the base substrate 1, the flatness of the base substrate 1 is improved. Such improved flatness allows the liquid crystal molecules in the LCD apparatus 36 to be easily aligned. In the case that the two-terminal device 14 is used in a reflection type LCD apparatus, the light scattering characteristic of the LCD apparatus 36 is enhanced.

EXAMPLE 11

In an eleventh example according to the present invention, another method for producing the LCD apparatus 36 illustrated in FIGS. 18 and 19 will be described with reference to FIG. 21.

FIG. 21 is a schematic illustration of a part of a process for producing the LCD apparatus 36 for solving the problem of insufficient insulation of the first electrode 4 by the ZnS layer 3.

First, a film of Ta is formed on the base substrate 1 in a specified thickness by sputtering and patterned into a specified pattern to form the scanning line 2 having the first electrode 4 (part (a)). The thickness of the scanning line 2 is 300 nm in the eleventh example. The scanning line 2 having the first electrode 4 may be formed of a conductive thin film of titanium, molybdenum, aluminum, copper, ITO or the like instead of Ta. As an etchant for patterning, a mixed solution of hydrofluoric acid and nitric acid is used.

The ZnS layer 3 is formed on the base substrate 1 to cover the first electrode 2 by sputtering in a thickness of 200 nm (part (b)). Then, the ZnS layer 3 is patterned into a specified pattern using the photoresist 17 and the mask 18 (parts (c) and (d)). Namely, a part of the photoresist 17 and a part of the ZnS layer 3 exposed to light are removed. As the photoresist 17, a positive photoresist OFPR-800 produced by Tokyo Ohka Kabushiki Kaisha is used in the eleventh example, but a negative photoresist may be used. As an etchant for patterning the ZnS layer 3 after development, hydrochloric acid is used.

Then, a film of $SiO_x$ for forming the insulation layer 16 is formed on the base substrate 1 to cover the photoresist 17 by sputtering in a thickness of 1.0 μm, the ZnS layer 3 and the first electrode 4 (part (e)). The insulation layer 16 may be formed of an insulating material such as $SiN_x$ or a photoresist.

The photoresist 17 and the $SiO_x$ layer on the photoresist 17 are peeled off by a lift-off method (part (f)) to form the insulation layer 16 having the hole 19 at a portion corresponding to the ZnS layer 3. The insulation layer 16 covers the base substrate 1 and the first electrode 4 except for an area on which the ZnS layer 3 is located. In other words, the ZnS layer 3 is only in the hole 19 of the insulation layer 16, namely, in the area of the two-terminal device 14. As the peeling-off liquid, OMR-710 produced by Tokyo Ohka Kabushiki Kaisha is used.

A film of ITO is formed on the insulation layer 16 to cover the ZnS layer 3 by sputtering to a thickness of 200 nm, and patterned to form the pixel electrode 5 having the second electrode 8 (part (g)). The pixel electrode 5 having the second electrode 8 may be formed of a conductive material such as aluminum, tantalum, titanium, molybdenum or copper instead of ITO. As an etchant for patterning the ITO film, hydrobromic acid is used.

The two-terminal device 14 produced in the above-described manner includes a flat portion of the first electrode 4 but excludes a side portion and the vicinity thereof including an edge formed at the junction of a top surface 28 and a side surface 29 of the first electrode 4 and another edge formed at the junction of the side surface 29 and the interface between the first electrode 4 and the base substrate 1. Accordingly, insulation breakdown caused by insufficient insulation of the side portion of the first electrode 4 and the vicinity thereof by the insulation layer 16 does not influence the performance of the two-terminal device 14, and therefore a desirable I-V characteristic is obtained.

Since the ZnS layer 3 is formed only in the hole 19, namely, in the area of the two-terminal device 14, the inconveniences such as increases in the leak current and fluctuations in impedance in accordance with the change in the applied voltage caused by the ZnS layer 3 formed on the area other than the two-terminal device 14 can be avoided.

Further, since the insulation layer 6 covers the entire top surface of the base substrate 1, the flatness of the base substrate 1 is improved. Such improved flatness allows the liquid crystal molecules in the LCD apparatus 36 to be easily aligned. In the case that the two-terminal device 14 is used in a reflection type LCD apparatus 36 is enhanced.

EXAMPLE 12

In a twelfth example according to the present invention, a two-terminal device for a display apparatus and a method for producing the same for solving the problem of insufficient insulation of the first electrode 4 by the ZnS layer 3 will be described with reference to FIGS. 22 and 23.

Figure 22:
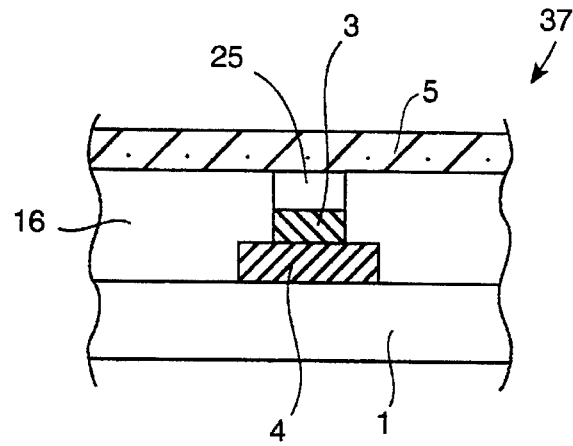
FIG 22 is a partial cross sectional view of an LCD apparatus in a twelfth and a thirteenth examples according to the present invention.

FIG. 22 is a partial cross sectional view of an LCD apparatus 37 in the twelfth example. A top view of the LCD apparatus 37 is similar to that of the LCD apparatus 36 shown in FIG. 18.

As is shown in FIG. 22, the LCD apparatus 37 includes the base substrate 1. The scanning line 2 (not shown) is on the top surface of the base substrate 1, and the first electrode 4 is branched from the scanning line 2. The ZnS layer 3 acting as an active layer is on a specified area of the first electrode 4. It should be noted that the ZnS layer 3 is not on the entire base substrate 1. The insulation layer 16 is on the base substrate 1, covering the first electrode 4 except for an area on which the ZnS layer 3 is located. The insulation layer 16 has a greater thickness than that of the ZnS layer 3. A second electrode 25 formed of a conductive thin film is on the ZnS layer 3. The pixel electrode 5 is on the insulation layer 16, covering the second electrode 25. The two-terminal device 14 includes the three-layer structure including the first electrode 4, the ZnS layer 3 and the second electrode 25.

The LCD apparatus 37 having the above-described structure is produced in the following manner.

FIG. 23 is a schematic illustration of a part of the process for producing the LCD apparatus 37.

First, a film of Ta is formed on the base substrate 1 in a specified thickness by sputtering and patterned into a specified pattern so as to form the scanning line 2 having the first electrode 4 (part (a)). The thickness of the scanning line 2 is 300 nm in the twelfth example. The scanning line 2 having the first electrode 4 may be formed of a conductive thin film of titanium, molybdenum, aluminum, copper, ITO or the like instead of Ta. As an etchant for patterning, a mixed solution of hydrofluoric acid and nitric acid is used.

Then, the insulation layer 16 is formed as is illustrated in parts (b) through (d).

A film of $SiO_x$ is formed on the base substrate 1 to cover the first electrode 4 in a thickness of 1.0 μm (part (b)). Then, the film of $SiO_x$ is patterned into a specified pattern using a photoresist 17 and a mask 18 (parts (c) and (d)). In this way, the insulation layer 16 having the hole 19 at the portion corresponding to the two-terminal device 14 is formed. As the photoresist 17, a positive photoresist OFPR-800 produced by Tokyo Ohka Kabushiki Kaisha is used in the tenth example, but a negative photoresist may be used. The patterning after development is performed by dry etching. The insulation layer 16 may be formed of an insulating material such as $SiN_x$, $Al_2O_3$, or AlN instead of $SiO_x$.

Then, the ZnS layer 3 is formed on the photoresist 17 to cover the first electrode 4 by sputtering in a thickness of 200 nm (part (e)).

A conductive thin film for forming the second electrode 25 is formed on the ZnS layer 3 by sputtering to a thickness of 800 nm (part (f)). In the twelfth example, titanium is used for the conductive thin film. Instead of titanium, aluminum, ITO, tantalum, molybdenum, copper or the like may be used.

The photoresist 17, and a part of the ZnS layer 3 and a part of the conductive film both corresponding to the photoresist 17 are peeled off by a lift-off method to keep the ZnS layer 3 only in the hole 19 and also to form the second electrode 25 only in the hole 19 (part (g)). In other words, the ZnS layer 3 and the second electrode 3 are formed only in the area of the two-terminal device 14. As the peeling-off liquid, OMR-710 produced by Tokyo Ohka Kabushiki Kaisha is used.

A film of ITO is formed on the insulation layer 16 to cover the second electrode 25 by sputtering to a thickness of 200 nm and patterned to form the pixel electrode 5 (part (h)). The pixel electrode 5 may be formed of a conductive material such as aluminum, tantalum, titanium, molybdenum or copper instead of ITO. As an etchant for patterning the ITO film, a mixed solution of hydrofluoric acid and nitric acid is used.

In the twelfth example, the process for producing the LCD apparatus 37 requires the step of forming the second electrode 25 in addition to the production process of the LCD apparatus 36 described in the tenth and the eleventh examples. However, since the second electrode 25 and the pixel electrode 5 are formed of different materials from each other, the materials for the second electrode 25 and the pixel electrode 5 can be chosen from a wider selection of materials than in the tenth and the eleventh examples.

EXAMPLE 13

In a thirteenth example according to the present invention, another method for producing the LCD apparatus 37 illustrated in FIG. 22 will be described with reference to FIG. 24.

FIG. 24 is a schematic illustration of a part of a process for producing the LCD apparatus 37 for solving the problem of insufficient insulation of the first electrode 4 by the ZnS layer 3.

First, a film of Ta is formed on the base substrate 1 in a specified thickness by sputtering and patterned into a specified pattern to form the scanning line 2 having the first electrode 4 (part (a)). The thickness of the scanning line 2 is 300 nm in the thirteenth example. The scanning line 2 having the first electrode 4 may be formed of a conductive thin film of titanium, molybdenum, aluminum, copper, ITO or the like instead of Ta. As an etchant for patterning, a mixed solution of hydrofluoric acid and nitric acid is used.

The ZnS layer 3 is formed on the base substrate 1 to cover the first electrode 2 by sputtering in a thickness of 200 nm (part (b)). Then, a conductive thin film for forming the second electrode 25 is formed on the ZnS layer 3 by sputtering to a thickness of 800 nm (part (c)). The conductive thin film is formed of titanium. Instead of titanium, aluminum, ITO, tantalum, molybdenum, copper or the like may be used for the conductive thin film.

The ZnS layer 3 and the titanium film are patterned into a specified pattern using the photoresist 17 and the mask 18 (parts (d) and (e)). Namely, a part of the photoresist 17, a part of the ZnS layer 3 and a part of the titanium film exposed to light are removed. In this manner the titanium film is patterned to be the second electrode 25. As the photoresist 17, a positive photoresist OFPR-800 produced by Tokyo Ohka Kabushiki Kaisha is used in the eleventh example, but a negative photoresist may be used. As an etchant for patterning the titanium film after development, a mixture liquid of an aqueous solution of hydrogen peroxide and an aqueous solution of ammonia is used. As an etchant for patterning the ZnS layer 3 after development, hydrochloric acid is used.

Then, a film of $SiO_x$ for forming the insulation layer 16 is formed on the base substrate 1 to cover the photoresist 17, the second electrode 25, the ZnS layer 3 and the first electrode 4 by sputtering in a thickness of 1.0 μm (part (f)). The insulation layer 16 may be formed of an insulating material such as $SiN_x$ or a photoresist.

The photoresist 17 and the $SiO_x$ film on the photoresist 17 are peeled off by a lift-off method (part (g)) to form the insulation layer 16 enclosing the ZnS layer 3 and the second electrode 25. The insulation layer 16 covers the base substrate 1 and the first electrode 4 except for an area on which the ZnS layer 3 and the second electrode 25 are located. In other words, the ZnS layer 3 is only in the area of the two-terminal device 14. As for the peeling-off liquid, OMR-710 produced by Tokyo Ohka Kabushiki Kaisha is used.

A film of ITO is formed on the insulation layer 16 to cover the second electrode 25 by sputtering to a thickness of 200 nm, and patterned to form the pixel electrode 5 (part (h)). The pixel electrode 5 may be formed of a conductive material such as aluminum, tantalum, titanium, molybdenum or copper instead of ITO. As an etchant for patterning the ITO film, hydrobromic acid is used.

In the thirteenth example, the process for producing the LCD apparatus 37 requires the step of forming the second electrode 25 in addition to the production process of the LCD apparatus 36 described in the tenth and the eleventh examples. However, since the second electrode 25 and the pixel electrode 5 are formed of different materials from each other, the materials for the second electrode 25 and the pixel electrode 5 can be chosen from a wider selection of materials than in the tenth and the eleventh examples.

EXAMPLE 14

Figure 25:
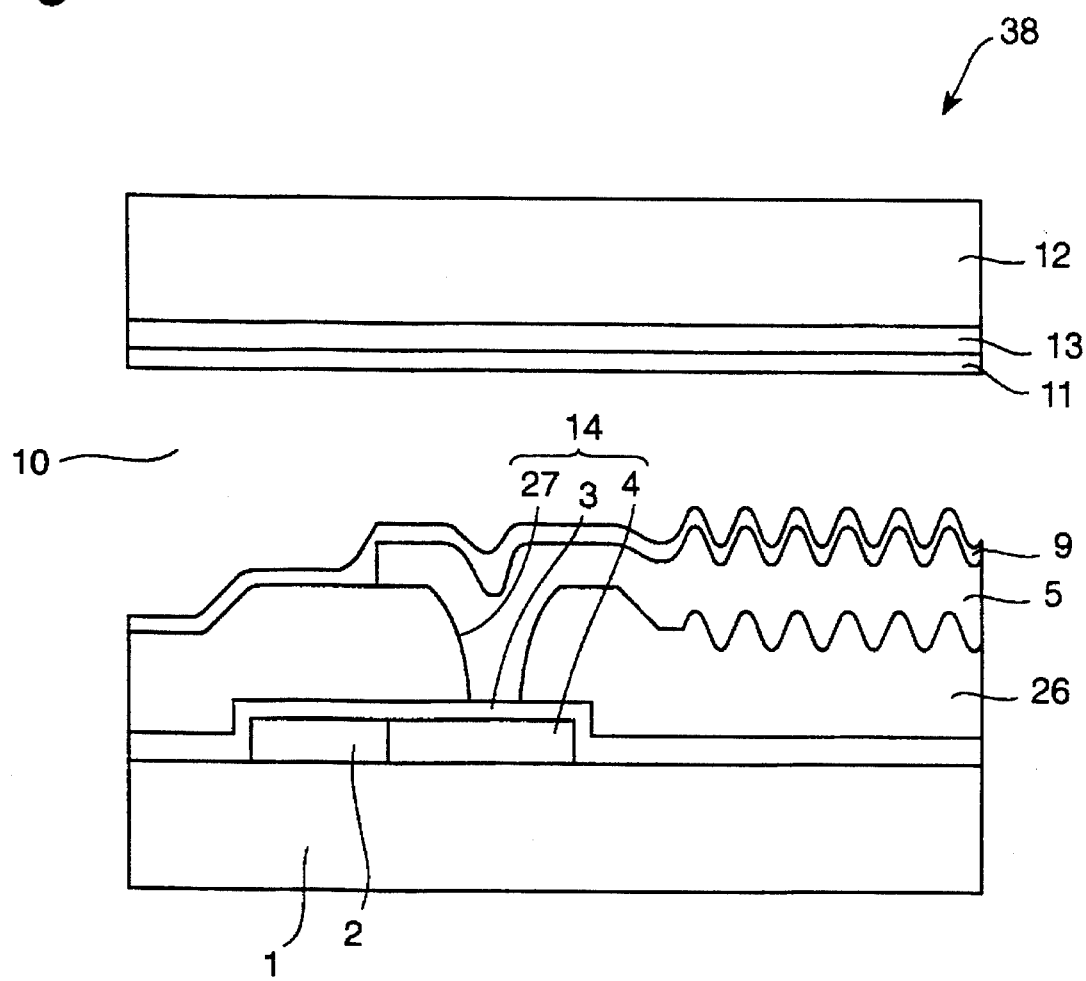
FIG. 25 is a partial cross sectional view of an LCD apparatus in a fourteenth and a fifteenth examples according to the present invention.
Figure 26:
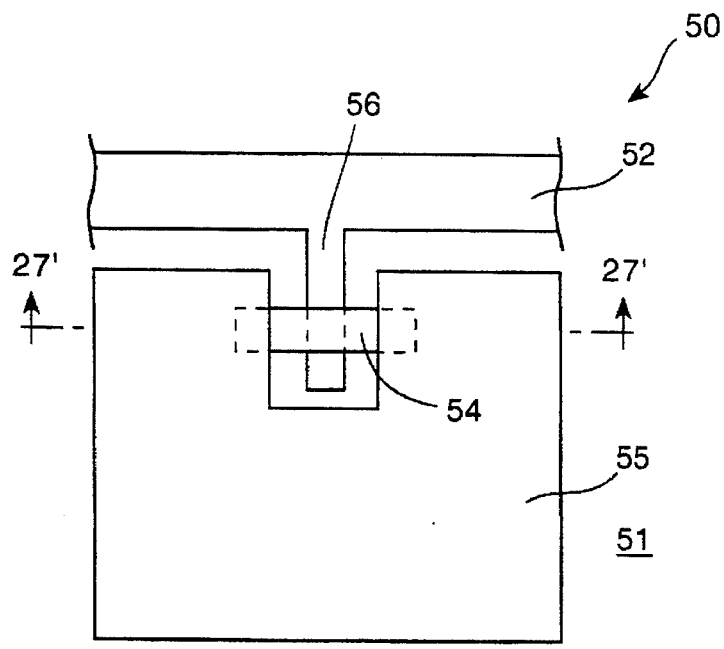
FIG. 26 is a partial top view of a conventional LCD apparatus.
Figure 27:
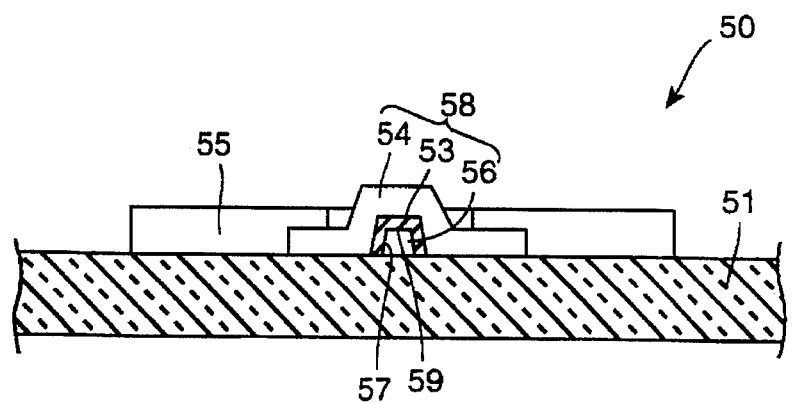
FIG. 27 is a cross sectional view of the LCD apparatus illustrated in FIG. 26 looking along section line 27'—27' in FIG. 26.
Figure 28:
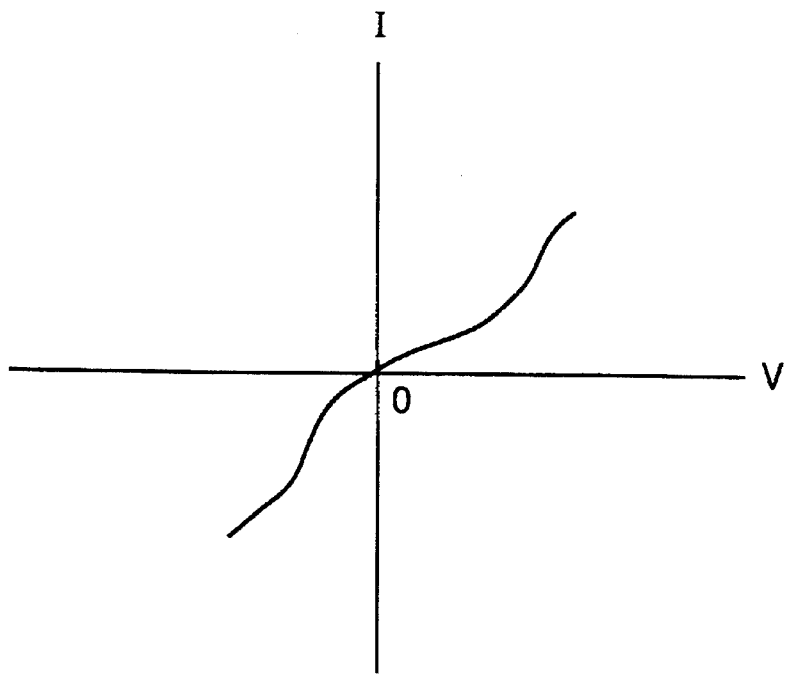
FIG. 28 is a graph illustrating a curve representing the I-V characteristic of a conventional MIM element.
Figure 29:
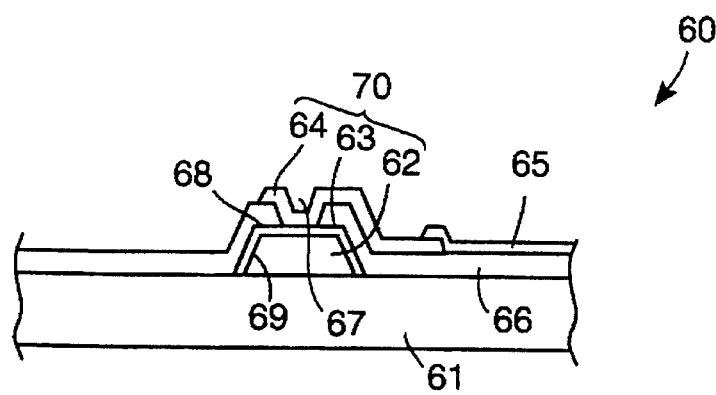
FIG. 29 is a cross sectional view illustrating another conventional MIM element.
Figure 30:
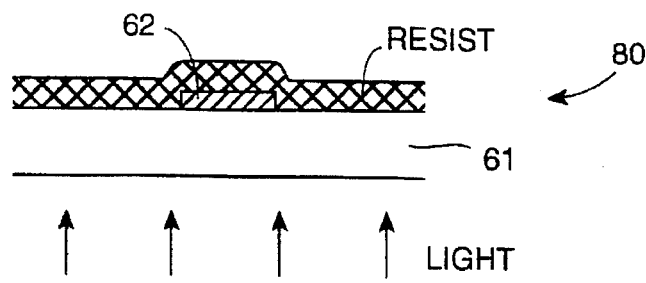
FIG. 30(a)–30(f) is a schematic illustration of a process for producing a conventional MIM element used in a conventional display apparatus.
Figure 30:
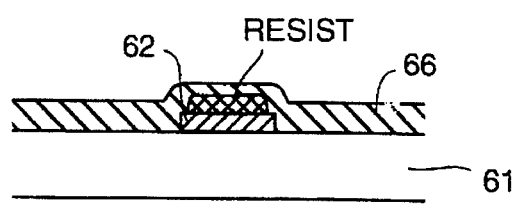
Figure 30:
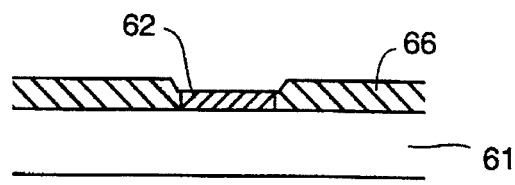
Figure 30:
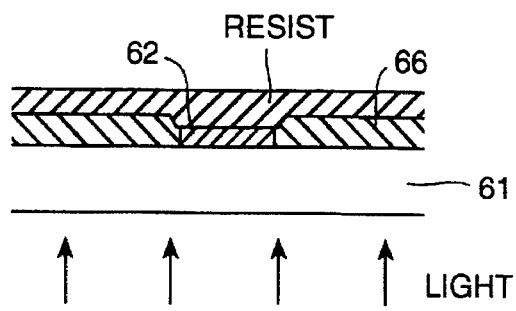
Figure 30:
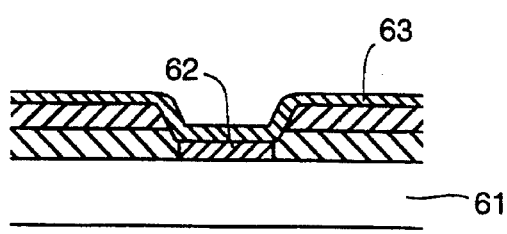
Figure 30:
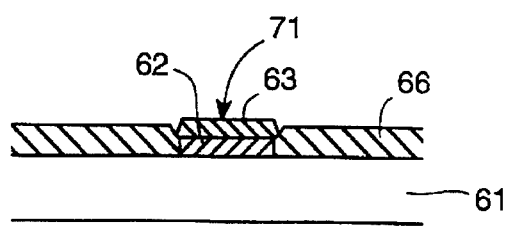

Referring to FIG. 25, a fourteenth example of a display apparatus according to the present invention will be described.

FIG. 25 is a partial cross sectional view of an LCD apparatus 38 in the fourteenth example according to the present invention.

The LCD apparatus 38 is produced in the following manner.

The production process of the LCD apparatus 38 is identical as the production process described in the first example until the ZnS layer 3 is formed. After the formation of the ZnS layer 3, an insulation layer 26 is formed of a photosensitive resin. Instead of the photosensitive resin, an inorganic oxide such as $SiO_2$ or $Al_2O_5$, an inorganic nitride such as $SiN_x$ or AlN, or an organic substance such as acrylic resins, polyimide, or polyurea may be used for the insulation layer 26. A hole 27 is formed in the insulation layer 26, at a portion corresponding to the two-terminal device 14. A part of a surface of the insulation layer 26 corresponding to the pixel is corrugated by a photographic process.

A conductive film is formed on the insulation layer 26 and patterned into a specified pattern to form the pixel electrode 5 having the second electrode 8. The pixel electrode 5 may be formed of Al, Ag, Cr, Ni, Cu, Ti or alloys thereof.

A top part of the hole 27 has an area of 10 μm² to 1,000 μm² inclusive. In the case that the area of the top part of the hole 27 is also too large, the capacitance of the two-terminal device 14 is too large, and thus the ratio of the capacitance of the liquid crystal layer 10 with respect to the capacitance of the two-terminal device 14 ($C_L/C_D$) is too small. Accordingly, the two-terminal device 14 is not supplied with a voltage at a sufficient level and is not conductive. As a result, the liquid crystal layer 10 is not supplied with a voltage at a sufficient level. By contrast, as the area of the top part of the hole 27 is too small, the ratio of the capacitance of the liquid crystal layer 10 with respect to the capacitance of the two-terminal device 14 ($C_L/C_D$) is sufficiently large. However, the amount of the current flowing through the liquid crystal layer 10 is too small, and thus the liquid crystal layer 10 is not sufficiently charged. For these reasons, it is important to choose an appropriate area of the top part of the hole 27.

After the formation of the pixel electrode 5, a material for the alignment film 9 is formed to cover the insulation layer 26 and the pixel electrode 5. The material is then cured and aligned to form the alignment film 9. In this manner, the lamination on the base substrate 1 is completed.

On an insulating counter substrate 12, counter electrodes 13 are formed in stripes in such a direction as to cross the pixel electrode 5. A material for the alignment film 11 is formed on the counter substrate 12 to cover the counter electrodes 13. The material is then cured and aligned to form the alignment film 11. In this manner, the lamination on the counter substrate 12 is completed.

The lamination on the base substrate 1 and the lamination on the counter substrate 12 are assembled together with spacers (not shown) sandwiched therebetween, and the liquid crystal is injected between the two laminations to form the liquid crystal layer 10. Thus, the LCD apparatus 38 is produced. In the fourteenth example, White-Taylor guest-host liquid crystal is used.

In the fourteenth example, the pixel electrode 5 is formed of metal in order to be suitable for a reflection type LCD apparatus. Since the surface of the insulation layer 26 is corrugated, a surface of the pixel electrode 5 formed on the insulation layer 26 is also corrugated. By such corrugation, the light incident on the LCD apparatus 38 is not reflected in such a manner as is reflected on a mirror surface, and thus the display quality is enhanced.

The White-Taylor guest host liquid crystal does not require a deflection plate, and therefore displays brighter images than the conventional twisted nematic liquid crystal when used in a reflection-type LCD apparatus. Even in a transmission type LCD apparatus, the White-Taylor guest host liquid crystal displays brighter images than the conventional twisted nematic liquid crystal.

The White-Taylor liquid crystal requires a high driving voltage. Accordingly, satisfactory displays cannot be obtained in an LCD apparatus including the conventional two-terminal device using $Ta_2O_5$ or $SiN_x$ in the case that the White-Taylor liquid crystal is used as the display medium. By using a two-terminal device using ZnS according to the present invention, satisfactory display is obtained even if the White-Taylor liquid crystal is used as the display medium.

EXAMPLE 15

In a fifteenth example according to the present invention, the insulation layer 26 of the LCD apparatus 38 is formed of an insulating color photoresist. Except for the material of the insulation layer 26, the LCD apparatus 38 is identical in structure with the LCD apparatus in the fourteenth example. As the color photoresist, for example, the Color Mosaic CK produced by Fuji Hunt Electronics Technology Kabushiki Kaisha is used.

The LCD apparatus 38 in the fifteenth example is produced in the following manner.

After the ZnS layer 3 is formed in the manner described in the first example, a layer of the color photoresist is formed on the ZnS layer 3 to a thickness of approximately 300 nm by a spinner. Then, the hole 27 is formed in the insulation layer 26 and the surface of the insulation layer 26 is corrugated in the manner described in the fourteenth example. After that, the production process of the LCD apparatus 38 in the fifteenth example is also identical with the production process described in the fourteenth example.

Due to the color photoresist used for the insulation layer 26, the light incident on an area other than the pixel is absorbed by the insulation layer 26. In other words, the insulation layer 26 acts as a black matrix, and thus the display contrast is improved.

As has been described so far, according to the present invention, the two-terminal device of the LCD apparatus includes an insulation layer (active layer) formed of ZnS, which has an I-V characteristic showing a continuous curve. Accordingly, a two-terminal having an I-V characteristic which is satisfactory both in steepness and symmetry and is excellent in nonlinearity can be obtained. A display apparatus including such a two-terminal device realizes high quality display.

In the case that the ZnS layer is heated, the uniformity in quality and the stability of the two-terminal device is improved. A display apparatus including such a two-terminal device has few defects in images and little dispersion in display quality among the pixels.

The ZnS layer is formed only on a flat portion of the surface of the first electrode. Accordingly, the side portion of the first electrode and the vicinity thereof including the edges of the first electrode is excluded from the two-terminal device. Due to such a structure, the problem caused in, for example, a conventional MIM element, namely, insulation breakdown caused by insufficient insulation of the side portion of the first metal layer and the vicinity thereof is solved.

In the case that the ZnS layer is formed only in the area of the two-terminal device, increase in the leak current and fluctuation in impedance in accordance with the change in the applied voltage which are caused by the ZnS layer formed in an area other than the two-terminal device is avoided.

By implanting various impurities into the ZnS layer during the formation of the ZnS layer, the I-V characteristic of the two-terminal device can easily be changed. Utilizing this fact, a two-terminal device having an optimum I-V characteristic in accordance with the display medium, the purpose for display, or the type of the display apparatus to be produced can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A display apparatus, comprising:
    a first substrate;
    a pixel electrode formed on the first substrate;
    a scanning line for carrying a signal to the pixel electrode for driving the pixel electrode;
    a switching device for receiving the signal from the scanning line and switching the pixel electrodes into one of a conductive state and a non-conductive state in accordance with the signal;
    a second substrate opposed to the first substrate;
    a counter electrode on the second substrate; and
    a display medium layer sandwiched between the first substrate and the second substrate;
    wherein the switching device includes a two-terminal element having:
        a first electrode which is a part of the scanning line;
        a zinc sulfide layer on the first electrode, said zinc sulfide layer having an I-V characteristic expressed by a continuous curve, said I-V characteristic having controlled steepness and symmetry; and
        a second electrode located on the zinc sulfide layer and electrically connected to the pixel electrode.

2. A display apparatus according to claim 1, wherein the zinc sulfide layer has a thickness of 10 nm to 1 µm.

3. A display apparatus according to claim 1, wherein the zinc sulfide layer is on an entire surface of the first substrate, covering the scanning line.

4. A display apparatus according to claim 1, wherein the zinc sulfide layer is formed on a specified area of the first electrode excluding an edge portion of the first electrode.

5. A display apparatus according to claim 1, wherein the first electrode is branched from the scanning line.

6. A display apparatus according to claim 5, wherein the second electrode is a specified area within the pixel electrode.

7. A display apparatus according to claim 1, wherein the first electrode is a specified area within the scanning line.

8. A display apparatus according to claim 1, wherein the second electrode and the pixel electrode are formed of an identical material.

9. A display apparatus according to claim 1, wherein the second electrode is branched from the pixel electrode.

10. A display apparatus according to claim 1, further comprising a first insulation layer sandwiched between the first electrode and the zinc sulfide layer.

11. A display apparatus according to claim 10, further comprising a second insulation layer sandwiched between the zinc sulfide layer and the second electrode.

12. A display apparatus according to claim 11, wherein the second insulation layer has a hole, through which the second electrode and the zinc sulfide layer are electrically connected with each other.

13. A display apparatus according to claim 12, wherein the hole has an opening having an area of 10 µm$^2$ to 1,000 µm$^2$ inclusive.

14. A display apparatus according to claim 12, wherein the second insulation layer has a corrugated surface.

15. A display apparatus according to claim 14, wherein the second insulation layer is formed of a color photoresist.

16. A display apparatus according to claim 15, wherein the display medium is a White-Taylor guest-host liquid crystal.

17. A display apparatus according to claim 11, wherein the second insulation layer is formed of a substance selected from the group consisting of nitrogen compounds and silicon oxide.

18. A display apparatus according to claim 7, wherein at least one of the pixel electrodes, the first electrode and the second electrode is formed of a transparent conductive layer.

19. A display apparatus according to claim 11, wherein the second insulation layer includes a plurality of insulation layers formed of different substances.

20. A display apparatus according to claim 1, further comprising a first insulation layer sandwiched between the first electrode and the zinc sulfide layer and a second insulation layer between the zinc sulfide layer and the second electrode.

21. A display apparatus according to claim 20, wherein the first insulation layer and the second insulation layer are formed of an identical material with each other.

22. A display apparatus according to claim 20, wherein the second insulation layer has a hole, through which the second electrode and the zinc sulfide layer are electrically connected with each other.

23. A display apparatus according to claim 22, wherein the hole has an opening having an area of 10 µm$^2$ to 1,000 µm$^2$ inclusive.

24. A display apparatus according to claim 22, wherein the second insulation layer has a corrugated surface.

25. A display apparatus according to claim 24, wherein the second insulation layer is formed of a color photoresist.

26. A display apparatus according to claim 25, wherein the display medium is a White-Taylor guest-host liquid crystal.

27. A display apparatus according to claim 20, wherein the first insulation layer and the second insulation layer are each formed of a substance selected from the group consisting of nitrogen compounds and silicon oxide.

28. A display apparatus according to claim 27, wherein at least one of the pixel electrodes, the first electrode and the second electrode is formed of a transparent conductive layer.

29. A display apparatus according to claim 20, wherein the first insulation layer and the second insulation layer each includes a plurality of insulation layers formed of different substances.

30. A display apparatus according to claim 1, wherein the zinc sulfide layer includes an impurity.

31. A display apparatus according to claim 30, wherein the impurity is selected from the group consisting of manganese, copper, rare earth elements, compounds including a rare earth element, and the III-group elements.

32. A display apparatus according to claim 1, wherein the zinc sulfide layer is formed so as to have a composition ratio expressed by $1>x>0.5$ where the zinc sulfide layer has a composition expressed by $Zn_xS_{(1-x)}$.

33. A display apparatus according to claim 1, wherein the pixel electrode is formed of a substance selected from the group consisting of Al, Ag, Cr, Ni, Cu, Ti and alloys thereof.

34. A display apparatus according to claim 1, wherein the display medium is a liquid crystal.

35. A display apparatus according to claim 1, further comprising a plurality of insulation layers on the first substrate for supplying the first substrate with an insulating property.

36. A display apparatus comprising:
    a first substrate;
    a pixel electrode formed on the first substrate;
    a scanning line for carrying a signal to the pixel electrode for driving the pixel electrode;

a switching device for receiving the signal from the scanning line and switching the pixel electrodes into one of a conductive state and a non-conductive state in accordance with the signal;
a second substrate opposed to the first substrate;
a counter electrode on the second substrate; and
a display medium layer sandwiched between the first substrate and the second substrate;
wherein the switching device includes a two-terminal element having:
 a first electrode which is a part of the scanning line;
 a zinc sulfide layer formed on a specified area of the first electrode excluding an edge portion of the first electrode;
 a second electrode located on the zinc sulfide layer and electrically connected to the pixel electrode; and
an insulation layer sandwiched between the pixel electrode and the first substrate except for the specified area on which the zinc sulfide layer is located.

37. A display apparatus comprising:
a first substrate;
a pixel electrode formed on the first substrate;
a scanning line for carrying a signal to the pixel electrode for driving the pixel electrode;
a switching device for receiving the signal from the scanning line and switching the pixel electrodes into one of a conductive state and a non-conductive state in accordance with the signal;
a second substrate opposed to the first substrate;
a counter electrode on the second substrate; and
a display medium layer sandwiched between the first substrate and the second substrate;
wherein the switching device includes a two-terminal element having:
 a first electrode which is a part of the scanning line;
 a zinc sulfide layer on the first electrode, said zinc sulfide layer having an I-V characteristic expressed by a continuous curve;
 a second electrode located on the zinc sulfide layer and electrically connected to the pixel electrode; and
a first insulation layer sandwiched between the first electrode and the zinc sulfide layer, wherein the first insulation layer is obtained by anodizing the first electrode.

38. A display apparatus comprising:
a first substrate;
a pixel electrode formed on the first substrate;
a scanning line for carrying a signal to the pixel electrode for driving the pixel electrode;
a switching device for receiving the signal from the scanning line and switching the pixel electrodes into one of a conductive state and a non-conductive state in accordance with the signal;
a second substrate opposed to the first substrate;
a counter electrode on the second substrate; and
a display medium layer sandwiched between the first substrate and the second substrate;
wherein the switching device includes a two-terminal element having:
 a first electrode which is a part of the scanning line;
 a zinc sulfide layer on the first electrode, said zinc sulfide layer having an I-V characteristic expressed by a continuous curve;
 a second electrode located on the zinc sulfide layer and electrically connected to the pixel electrode and
a first insulation layer sandwiched between the first electrode and the zinc sulfide layer and a second insulation layer between the zinc sulfide layer and the second electrode,
wherein the first insulation layer is obtained by anodizing the first insulation layer.

39. A display apparatus comprising:
a first substrate;
a pixel electrode formed on the first substrate;
a scanning line for carrying a signal to the pixel electrode for driving the pixel electrode;
a switching device for receiving the signal from the scanning line and switching the pixel electrodes into one of a conductive state and a non-conductive state in accordance with the signal;
a second substrate opposed to the first substrate;
a counter electrode on the second substrate; and
a display medium layer sandwiched between the first substrate and the second substrate;
wherein the switching device includes a two-terminal element having:
 a first electrode which is a part of the scanning line;
 a zinc sulfide layer on the first electrode, said zinc sulfide layer having an I-V characteristic expressed by a continuous curve;
 a second electrode located on the zinc sulfide layer and electrically connected to the pixel electrode; and
 a second insulation layer sandwiched between the zinc sulfide layer and the second electrode,
wherein the first insulation layer is formed of a substance selected from the group consisting of nitrogen compounds and silicon oxide.

40. A display apparatus according to claim 39, wherein at least one of the pixel electrodes, the first electrode and the second electrode is formed of a transparent conductive layer.

41. A display apparatus comprising:
a first substrate;
a pixel electrode formed on the first substrate;
a scanning line for carrying a signal to the pixel electrode for driving the pixel electrode;
a switching device for receiving the signal from the scanning line and switching the pixel electrodes into one of a conductive state and a non-conductive state in accordance with the signal;
a second substrate opposed to the first substrate;
a counter electrode on the second substrate; and
a display medium layer sandwiched between the first substrate and the second substrate;
wherein the switching device includes a two-terminal element having:
 a first electrode which is a part of the scanning line;
 a zinc sulfide layer on the first electrode, said zinc sulfide layer having an I-V characteristic expressed by a continuous curve;
 a second electrode located on the zinc sulfide layer and electrically connected to the pixel electrode; and
a first insulation layer sandwiched between the first electrode and the zinc sulfide layer,
wherein the first insulation layer includes a plurality of insulation layers formed of different substances.

* * * * *